(12) United States Patent
Bushnell et al.

(10) Patent No.: US 6,247,154 B1
(45) Date of Patent: Jun. 12, 2001

(54) METHOD AND APPARATUS FOR COMBINED STUCK-AT FAULT AND PARTIAL-SCANNED DELAY-FAULT BUILT-IN SELF TEST

(75) Inventors: Michael L. Bushnell, East Windsor, NJ (US); Ganapathy Parthasarathy, Hillsboro, OR (US)

(73) Assignee: Rutgers, The State University of New Jersey, Piscataway, NJ (US)

( * ) Notice: Subject to any disclaimer, the term of this patent is extended or adjusted under 35 U.S.C. 154(b) by 0 days.

(21) Appl. No.: 09/260,836

(22) Filed: Mar. 2, 1999

Related U.S. Application Data

(60) Provisional application No. 60/076,810, filed on Mar. 3, 1998.

(51) Int. Cl.[7] .................................................. H04B 17/00
(52) U.S. Cl. ............................................. 714/733; 714/736
(58) Field of Search .................................. 714/733, 736, 714/738, 724

(56) References Cited

U.S. PATENT DOCUMENTS

| | | |
|---|---|---|
| 5,365,528 | 11/1994 | Agrawal et al. . |
| 5,422,891 * | 6/1995 | Bushnell et al. . |
| 5,422,981 | 6/1995 | Bushnell et al. . |
| 5,502,647 | 3/1996 | Chakradhar et al. . |
| 5,583,787 | 12/1996 | Underwood et al. . |
| 5,600,568 | 2/1997 | Iwakura et al. . |
| 5,742,617 | 4/1998 | Warren . |
| 5,831,437 | 11/1998 | Ramadoss et al. . |
| 6,148,425 * | 11/2000 | Bhawmik et al. . |

* cited by examiner

Primary Examiner—Phung M. Chung
(74) Attorney, Agent, or Firm—Mathews, Collins Shepherd & Gould, P.A.

(57) ABSTRACT

This invention relates to a method and apparatus for combined stuck-fault testing and partial scan delay-fault built-in self testing (BIST). For partial scan delay-fault BIST, the circuit is modeled for breaking all flip-flop feedback cycles in the circuit. A selection of flip-flops to be scanned to break all sequential cycles is determined from an optimal feedback vertex set. A digest, devour and tidy-up (DDT) heuristic can be used on a weighted signed graph formed from an S-graph of the circuit to determine an optimal feedback vertex set. Determined partial scan delay fault BIST hazards can be removed from the circuit by inserting parity flippers to invert selected paths during testing. The same DDT heuristic can be used to determine optimal placement of the parity flippers in the circuit.

25 Claims, 13 Drawing Sheets

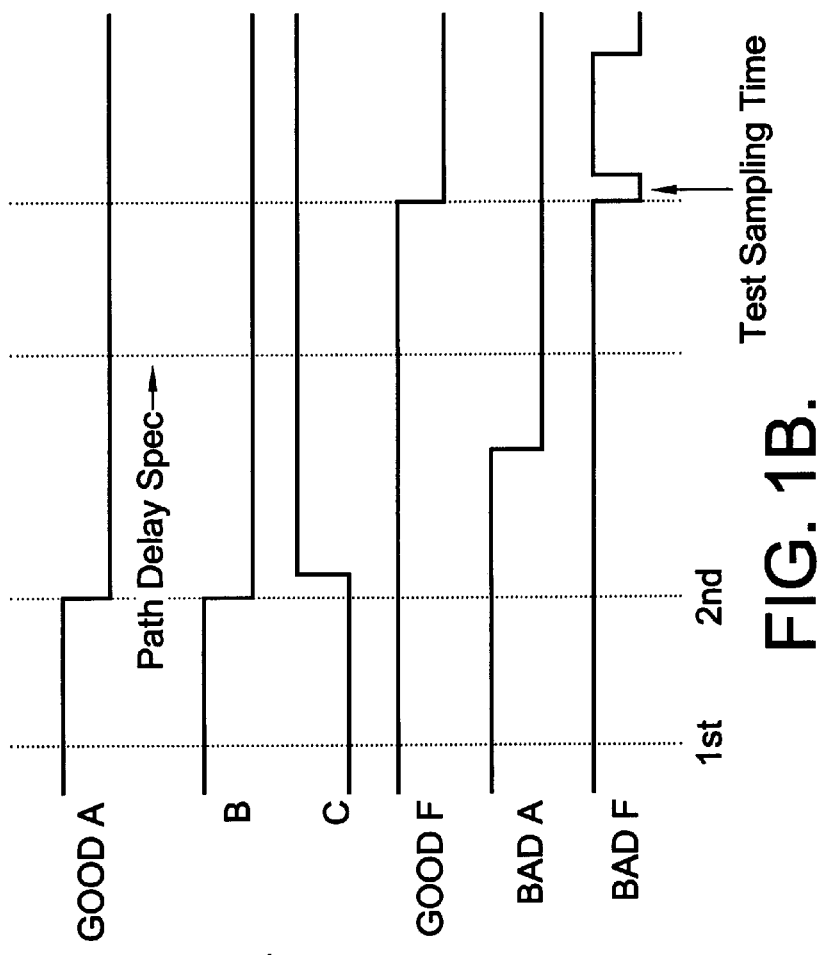
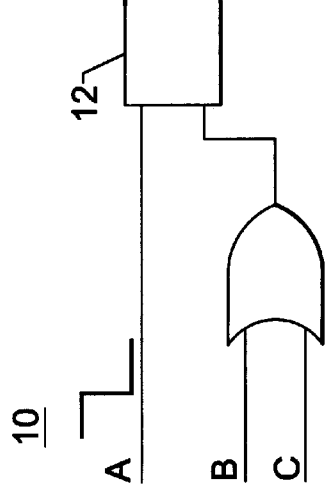
FIG. 1A.
FIG. 1B.

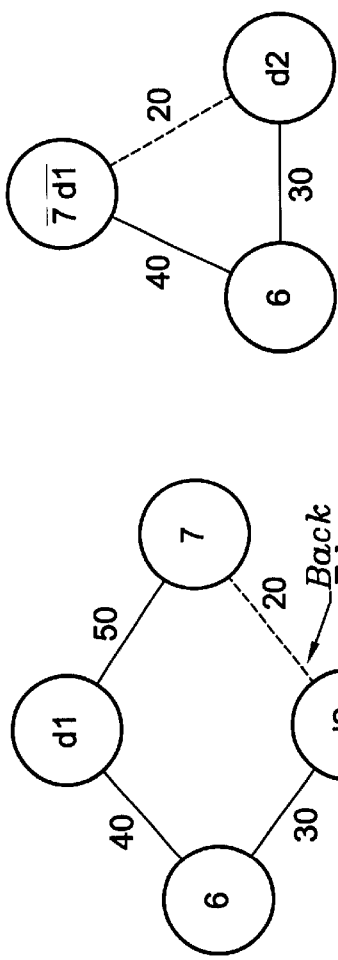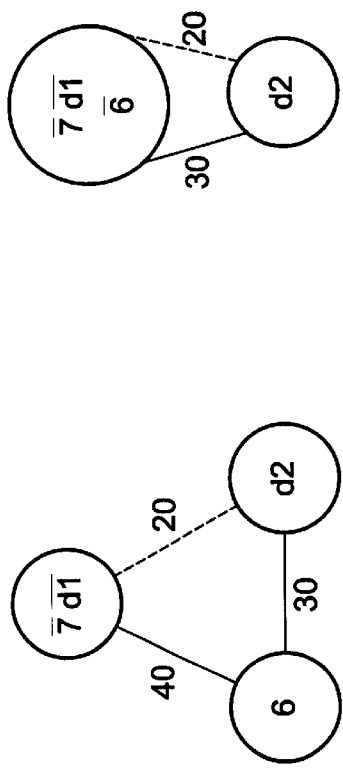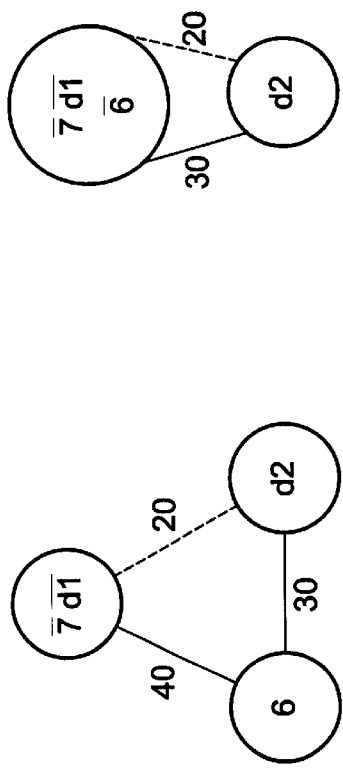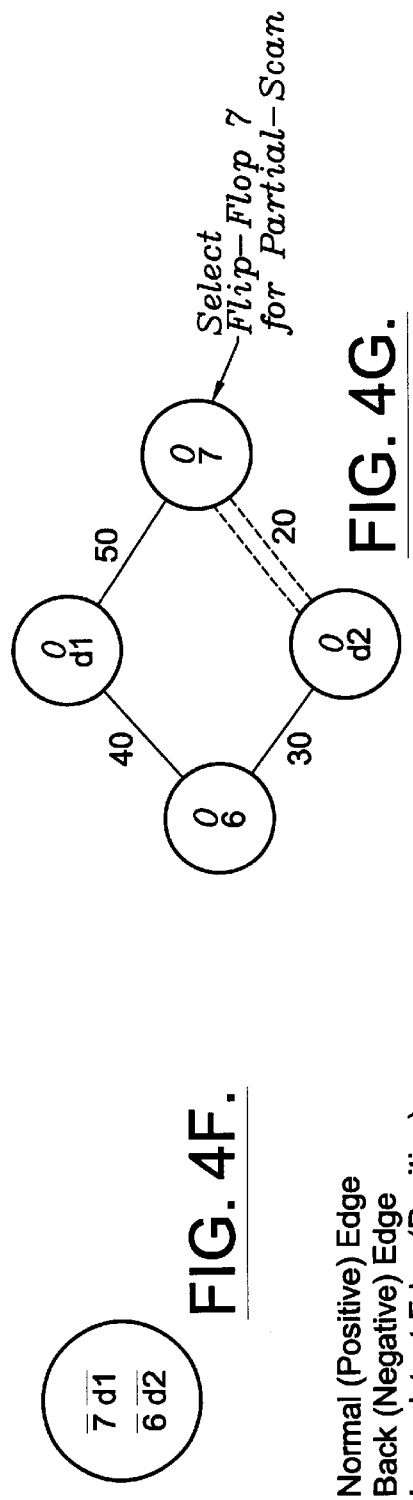
FIG. 4C.
FIG. 4D.
FIG. 4E.
FIG. 4F.
FIG. 4G.
——— Normal (Positive) Edge
----- Back (Negative) Edge
≡≡≡ Inconsistent Edge (Positive)
═══ Inconsistent Edge (Negative)

WSG Edges:
---------------- Negative
———————— Positive

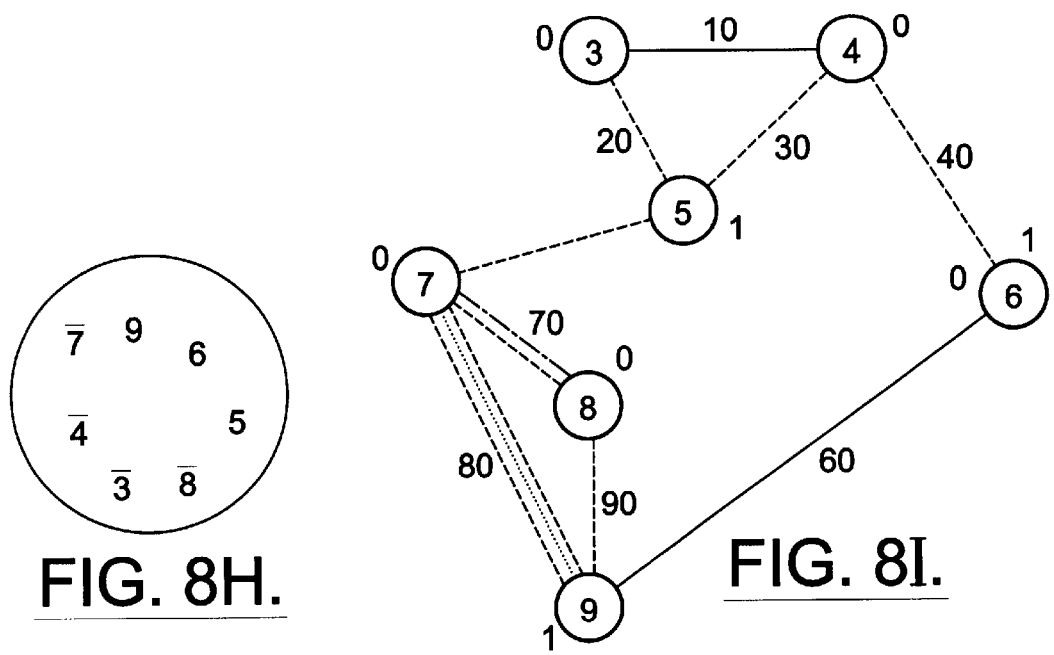
FIG. 8H.
FIG. 8I.
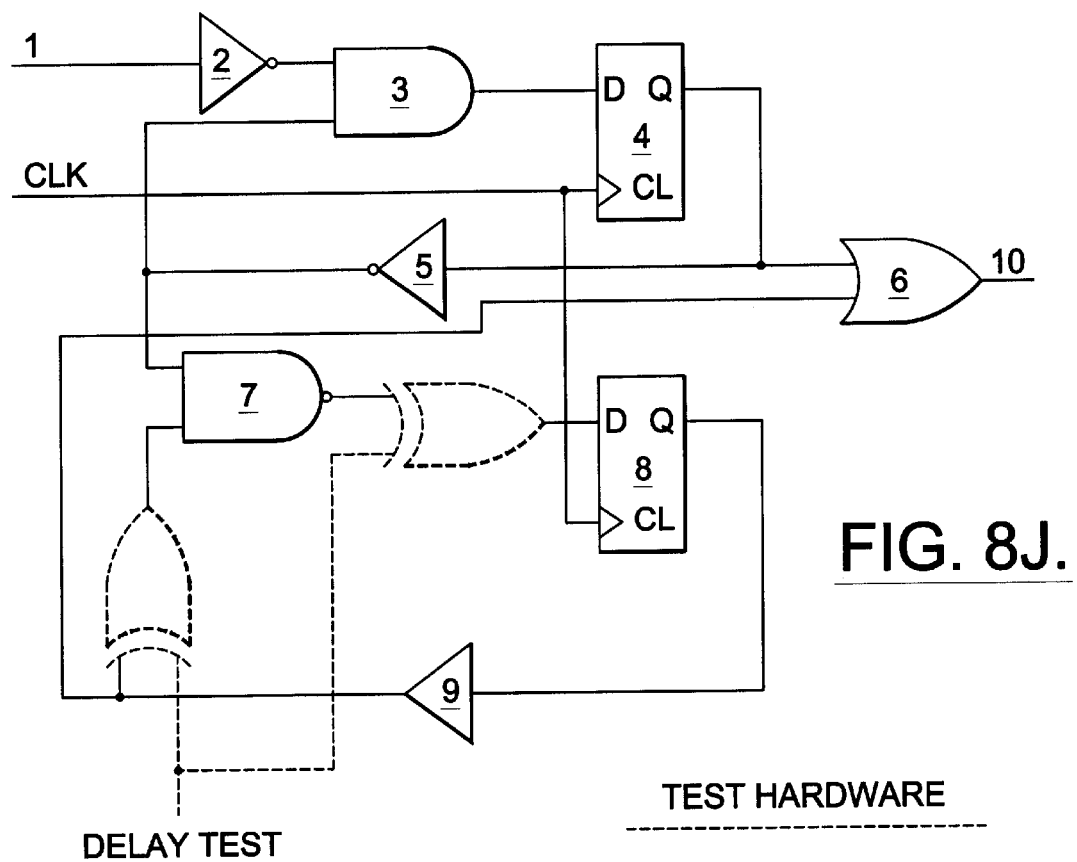
FIG. 8J.
DELAY TEST
TEST HARDWARE

——— Circuit critical timing path
- - - Circuit site that needs testability hardware to remove hazards

METHOD AND APPARATUS FOR COMBINED STUCK-AT FAULT AND PARTIAL-SCANNED DELAY-FAULT BUILT-IN SELF TEST

This application claims the benefit of U.S. Provisional Application No. 60/076,810 filed on Mar. 3, 1998 entitled Simultaneous Delay-Fault Built-In Self-Test and Partial-Scan Insertion hereby incorporated by reference into this application.

The invention was made with government support under DARPA grant number F33615-96-5610 awarded by the Air Force Manufacturing Technology Directorate, Wright Laboratory, Air Force Materiel Command, United States Air Force, Wright Patterson AFB, Ohio. The government has certain rights in this invention.

BACKGROUND OF THE INVENTION

1. Field of the Invention

This invention relates to a method and apparatus for testing sequential circuits with delay fault built-in self test (BIST) with partial scan insertion that can be combined with stuck-at fault testing.

2. Description of the Related Art

One conventional approach to testing digital electronic circuits is stuck-at fault testing. Many techniques have been used for stuck-at fault testing. Typically, stuck-at fault testing is accomplished by successively applying a set of test vectors to the input of a digital circuit to cause the circuit to generate a known response under normal operating conditions. If one or more stuck-at faults exist in the circuit, the response of one or more of the test vectors will differ from the known response. Stuck-at fault testing is useful for revealing many types of faults, however, this type of testing does not reveal path-delay faults.

A path delay-fault occurs when a circuit response requires more time than specified by design requirements of the circuit. The delay of a digital circuit is the maximum time needed for outputs of the circuit to be determined after inputs to the circuit have changed. Signal transitions can travel through paths from primary inputs, gates or flip-flop outputs to primary outputs or flip-flop inputs of the circuit. For example, a path delay-fault (PDF) models when the cumulative delay of propagating a transition along a path of the circuit exceeds a predetermined limit. The predetermined limit can be a clock period. Delay-fault testing can be used to check if the circuit meets the required clock rate or speed requirements by detecting PDFs in the circuit.

U.S. Pat. No. 5,422,891, ('891) issued to one of the inventors of this disclosure, describes a method for robust delay fault built-in self-testing of combinational integrated circuits. Combinational circuits include inputs, outputs and logic gates. Robust delay testing is used to test for an excessive path delay of a tested path independently of other path delays in the circuit. In the method, hazardous nodes of the IC are determined. A hazardous node is a gate whose output momentarily switches from the correct output for a brief time period. Cut-points are inserted in the circuit to divert input to hazardous nodes to an observation point. An output multi-input signature register (MISR) at the observation point generates a first signature. An output MISR provides a second signature for outputs to the IC. During testing, a hazard-free input pattern is applied to the IC and the generated first and second signatures are compared to known correct signatures.

In the '891 patent it is disclosed that an example of a hazardous node which is a reconvergent fanout circuit. Reconvergent fanout circuit splits into at least two paths before it reconverges at another point in the circuit. Signal parity can be defined as the number of inversions a signal is subject to as it travels along a path. A reconvergent fanout circuit can have a hazard if the paths are of opposite signal parity. For example, output paths from a NAND gate can reconverge at an OR gate. One of the paths is inverted with an inverter to produce odd signal parity on the path. The other path from a NAND gate has even signal parity. A hazard can occur at hazardous node the OR gate since one path has opposite signal parity to the other path. Either path can be cut to avoid a hazard at hazardous node. If there are more than two paths reconverging, than either all odd parity paths or all even parity paths can be cut. Accordingly, XOR and equivalence gates are modified such that a first path is inverted and a second path is non-inverted for eliminating hazards on the gates. Alternatively, hazardous nodes can be eliminated during testing for eliminating opposite parity at the hazardous node during testing.

Circuits can also include sequential elements such as flip-flops. A sequential delay test can use a pair of vectors to start a signal transition down a path, propagate the transition along a path and allow fault observation at the path end. Scan testing has been used to test sequential circuits is by inserting scan chain hardware on all flip-flops of the circuit. In scan mode, all flip-flops behave similar to a shift register, such that the memory in the circuit can be serially scanned out through a pin on the chip. This method has the disadvantage of adding hardware to each flip-flop on the chip. The additional hardware creates added expense and power requirements of the circuit. Also, scan testing is slow because of the shifting of the scan chain in and out of the chip.

Other techniques have been disclosed for detecting delay faults along a signal path within a sequential digital circuit which do not use a full-scan. U.S. Pat. No. 5,502,647 describes partial scan testing of sequential circuits. In this partial scan methodology flip-flops are selected such that the minimum feedback vertex set (MFVS) of a flip-flop dependency graph of all loops, except self-loops, are broken. The MFVS of the circuit, i.e. the minimum quantity of gates whose removal makes the circuit acyclic, is a lower bound and in many cases is significantly smaller than the MFVS of the flip-flop dependency graph. Flip-flops are repositioned so that, in a modified circuit, every circuit MFVS gate drives one flip-flop that can be scanned. Resynthesis and retiming is used to transform any circuit into an equivalent circuit whose flip-flop dependency graph MFVS is equal to the MFVS of the original circuit.

U.S. Pat. No. 5,365,528 describes a method for testing delay faults in non-scan sequential circuits. In this method, in order to detect a delay fault along a signal path of interest in a sequential digital circuit, a source flip-flop and a destination flip-flop, proximate the beginning and end of the path, respectively, are designated in the circuit. Next, the signal path is activated to establish what logic values are necessary at the input of each of a set of combinational elements in the path to propagate a selected signal transition from the source flip-flop to the destination flip-flop. A first and second backward justification process is carried out to synthesize a first sequence to propagate a selected logic value from a primary circuit input to the source flip-flop to cause it to generate the selected signal transition to propagate to the destination flip-flop. A second backward justification process is carried out to synthesize a second vector sequence which serves to propagate the value latched in the destination flip-flop to a primary output. The vectors of the first and second sequences are then applied at periodic intervals using a slow clock, except that the rated clock is applied to the last vector of the first sequence to propagate the logic value affected by the delay fault ultimately to the primary output. By comparing the value propagated to the primary output to the expected correct logic value, a determination can be made as to the existence of a delay fault.

It is desirable to provide a method and system for reliable testing of path delay faults of sequential circuits with minimal hardware.

SUMMARY OF THE INVENTION

Briefly described, the present invention comprises a method and apparatus for combined stuck fault testing and partial scan delay-fault built-in self testing (BIST). For stuck fault testing, a succession of first input patterns are applied to the circuit for generating stuck-fault output responses. For example, the first input patterns can be generated by a linear feedback shift register. Stuck fault output responses are processed by a multi input signature register (MISR) to provide a first signature.

For partial scan delay-fault BIST, the circuit is modeled for breaking all flip-flop feedback cycles in the circuit. An optimal feedback vertex set is determined from an S-graph of the circuit corresponding to flip-flops to be scanned during testing to break all sequential cycles. A devour, digest and tidy up (DDT) heuristic can be used on a weighted signed graph of the S-graph to determine the feedback vertex set. Preferably, short paths in the circuit having a cumulative worst case rising or falling transition that is so short that it will settle well before the next clock edge appears are eliminated from the partial scan delay-fault BIST model. A one bit changing second input pattern can be applied to the circuit for generating partial scan delay-fault BIST output responses. Partial scan delay-fault BIST output responses can be processed with a built in logic block observer to form a second signature. The first and second signatures are compared to known connect signatures.

In addition, after modeling the circuit for partial scan delay fault BIST, hazards can be removed from the circuit by inserting parity flippers during testing to invert selected paths such that reconvergent paths have equal parity. The same DDT heuristic can be applied to a weighted signed graph of logic gates forming cycles in the circuit for determining the minimal number of parity flippers to insert and optimal positioning of the parity flippers to reduce testing delays of the circuit.

The present invention has the advantage of minimal BIST hardware for testing the circuit to reduce clip area overhead.

The invention will be more fully described by reference to the following drawings.

BRIEF DESCRIPTION OF THE DRAWINGS

FIG. 1A is a circuit diagram of a circuit.

FIG. 1B is a circuit timing diagram for the circuit illustrated in FIG. 1A.

FIG. 4C is a weighted signed graph (WSG) of the S-graph shown in FIG. 4B.

FIG. 4D is a first contraction on the WSG shown in FIG. 4C determined from a devour, digest and tidy up (DDT) heuristic.

FIG. 4E is a second contraction on the WSG determined from the DDT heuristic.

FIG. 4F is a final contraction on the WSG determined from the DDT heurisitc.

FIG. 4G is the original WSG including Boolean assignments determined from the contractions.

FIG. 8H is a WSG after a last contraction using a DDT heuristic.

FIG. 8I is the WSG shown in FIG. 8B including Boolean assignments determined from the contractions.

FIG. 8J illustrates the circuit design of FIG. 8A including parity flippers activated during testing for eliminating hazards in the circuit.

DETAILED DESCRIPTION

Figure 2:
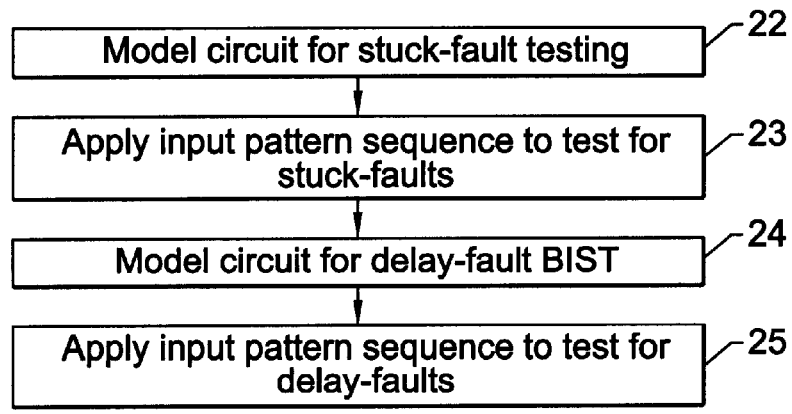
FIG. 2 is a flow diagram of a method for combined stuck fault testing and partial scan delay-fault built-in self test (BIST) in accordance with the principles of the present invention.

During the course of this description, like numbers will be used to identify like elements according to the different figures that illustrate the invention. A brief description of the concepts of partial scan testing is provided in order to facilitate an understanding of the present invention. A circuit is viewed as an interconnection of combinational logic gates and/or sequential elements, such as globally clocked flip-flops. Each flip-flop has a single input and a single output and all the flip-flops are clocked by the same periodic waveform. A logic net list can be used to represent the components and interconnections thereof.

A directed graph is a representation of a set of nodes and edges between the nodes which correspond respectively to the circuit components and paths between the components. An edge may be assigned a weight w. A directed loop is a connected sub-graph such that each node has at least one arc leaving and one arc entering. A self loop consists of a single node and a single arc from and to the node. Examples of directed graphs defined as flip-flop dependency graphs, are shown in U.S. Pat. No. 5,502,647, hereby incorporated by reference into this application.

A S-graph of a circuit is a directed graph that captures the signal dependencies among flip-flops in the circuit. The S-graph has a node for every flip-flop and an arc from node i to node j whenever there is a combinational path from flip-flop i to flip-flop j. The graph has a directed edge from flip-flop i to flip-flop j if a D/SET/RESET/T/J/K input of a flip-flop j can be reached from the Q or $\overline{Q}$ line of flip-flop i through combinational logic. An optimal feedback vertex set (FVS) is a representation of the minimal set of S-graph nodes whose removal makes the graph acylic. Optimal FVS identification is used in partial scan testing to identify the minimum number of flip-flops in a circuit to scan in order to break all the loops among the flip-flops.

A hazard occurs when there is an unintentional transition from the correct value for a period of time. FIG. 1A shows a simple circuit 10 in which the path from input A through AND gate 12 to output F is tested for a slow-to fall path delay fault. A circuit not having any modeled faults is defined as a "good" circuit and a circuit having one or more modeled faults is defined as a "bad" circuit. A signal having a transition that propagates correctly is defined as a "good" signal and a signal having a transition that is late, such as a falling transition that is late in falling, is defined as a "bad" signal. The circuit timing diagram illustrated in FIG. 1B shows that in a "good" circuit, signals A, B and C operate as "good" signals, and provide a "good" output signal F. Alternatively, when a significant path-delay fault is distributed along the path from input A through the AND gate to output signal F, signal A is late in falling and is represented by a "bad" signal. In a "bad" machine, a "bad" output signal F experiences a hazard and at a later time receives the falling transition of "bad" signal A. In a non-robust test, if output signal F is sampled between the first and second test patterns, the hazard appears on the "bad" output signal F. The hazard is introduced into the "bad" output signal F because the OR gate output must be held at "1" to propagate a transition from A to F. This can be achieved by holding B at "1" during the first pattern and then C at "1" during the second pattern. However, if a delay occurs on a path other than the one passing though a given delay-fault site the non-robust test will be invalidated.

In some cases, random circuit manufacturing delays can cause B to fall before C rises to introduce a hazard that fools the non-robust test to accept the circuit. This occurs because at the sampling time, the hazard makes it appear that the transition occurred on time, when in reality it was late. Robust delay testing is used to test for an excessive path delay for a tested path independently of other path delays in the circuit. Validatable non-robust delay testing and robust delay testing can be used to avoid the above-described problem. In validatable non-robust delay testing, other paths are first tested with a robust test and then the original paths to be tested are tested with a non-robust test since the other paths have been validated.

FIG. 2 is a flow diagram of the method for combined stuck-fault testing and partial-scan delay-fault built-in self test (BIST) 20 in accordance with the teachings of the present invention. In block 22, stuck-fault testing is performed to test the test hardware and circuit under test for stuck-faults. Stuck-fault testing can be performed with a conventional linear feedback (LFSR) pattern generator, as described in B. Koenenoon, J. Mucha and G. Zwiehoff, "Built-In Logic Block Observation Techniques", In Proc of the IEEE International Test Conf, pages 37–41, Cherry Hill, N.J., October 1979. In block 23, the LFSR generated pattern is applied to the circuit under test. The LFSR generated pattern propagates through the circuit. Output from the circuit is evaluated to determine if the circuit under test has any stuck-faults. During stuck-fault testing, hazards occur where they normally would during functional circuit operation. It will be appreciated that other conventional methods could be used for stuck-fault testing in accordance with the teachings of the present invention.

In block 24, delay-faults are modeled with a partial scan delay-fault BIST. The partial scan delay-fault BIST selects the minimum number of flop-flops to scan to break all feedback loops among flip-flops in the circuit under test, as is further described below. Preferably, a partial-scan chain can be implemented on the selected flip-flops using a built-in logic block observer (BILBO). The BILBO can be configured as a multiple input signature register (MISR) to compare responses arriving at it during testing. MISR outputs coming from the BILBO can be used to stimulate the portion of the circuit between the BILBO and the primary outputs such that the BILBO functions simultaneously as a pattern generator.

In block 25, during path-delay testing preferable hazard free input patterns are applied at primary inputs and scanned flip-flop outputs for activating the flip-flops and a hardware input generator. In a tester signature compare module 17, a hazard-free input pattern is applied to primary inputs of the circuit as well as to outputs of scanned flip-flops to generate a first and second signatures in order to avoid hazards in the response. A hazard-free input pattern can be defined as a sequence of input vectors that differ successively by one bit. The hazard-free input pattern initiates only one transition at any one of the primary inputs while all other primary inputs are held at a constant value. A hazard-free input pattern is a sequence that avoids multiple transitions on inputs to the circuit under test.

A hazard-free input pattern can be generated by a Gray code generator or a Johnson counter. A Gray code counter has the disadvantage that for large numbers of inputs the cycle time is too large for practical testing. A Johnson counter generates 2n basic patterns. A Johnson counter has the disadvantage of not supplying sufficient patterns for all fault sites in the circuit. Preferably, a modified Johnson counter including controlled complementation of the Johnson counter outputs is used for providing sufficient numbers of hazard-free input patterns. The above-described hazard-free input pattern generator is further described in U.S. Pat. No. 5,422,891 hereby incorporated by reference into this application. The circuit is hazard free when tested with the hardware pattern generator to obtain validatable non-robust delay fault testing using BIST.

After the hazard-free input pattern is applied to the circuit, primary outputs are checked with a multiple input signature register for comparing the outputs to a correct value during any clock period. Inputs to the scanned flip-flops are checked with a second multiple input signature register. If a wire or gate is too slow, then a signal being sampled by tester signature compare module will be incorrect. If the signature has an incorrect value an error signal will be generated in block and if the signature has a correct value the circuit testing is complete and the circuit is tested in module.

Figure 3:
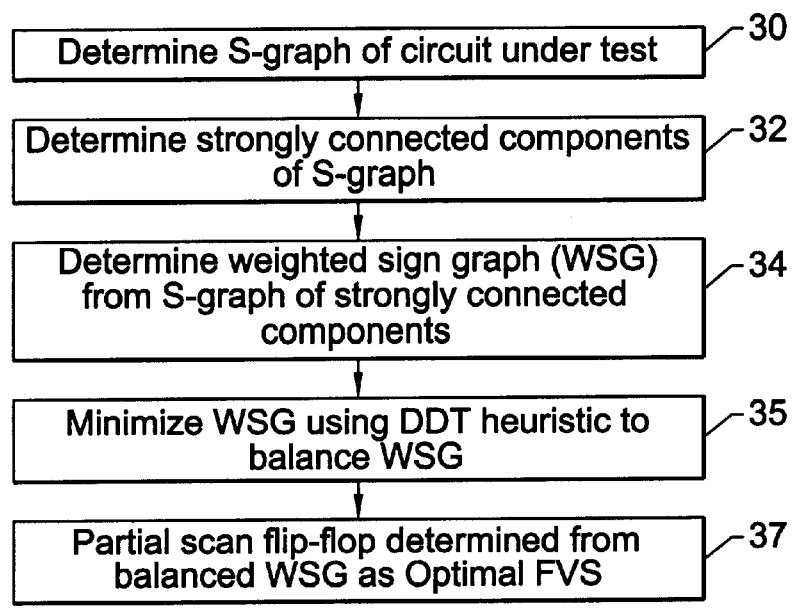
FIG. 3 is a flow diagram for modeling a circuit for partial scan delay-fault BIST.
Figure 4A:
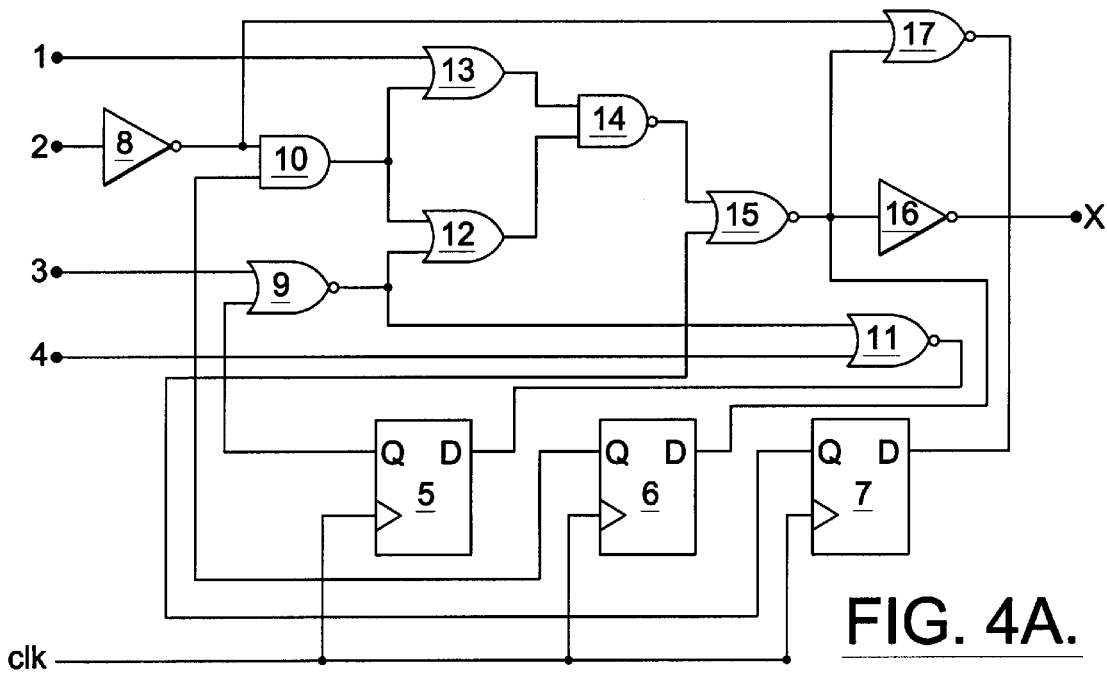
FIG. 4A is a circuit diagram of a benchmark $S_{27}$ circuit.
Figure 4B:
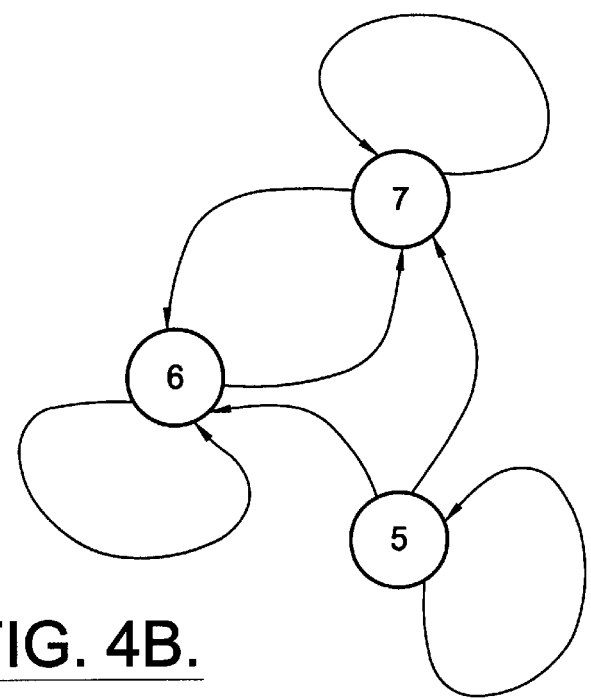
FIG. 4B is an S-graph of the circuit shown in FIG. 4A.

FIG. 3 illustrates a flow diagram of an implementation of block 24 for modeling the circuit for partial scan delay-fault BIST. In the implementation, partial scan flip-flop selection is used to test for path delay-faults. In block 30, an S-graph of the circuit to be tested is determined. For example, FIGS. 4A–4G illustrate a representation of the implementation. FIG. 4A is an example of a circuit to be tested which is a benchmark $s_{27}$ circuit. FIG. 4B represents an S-graph of the circuit shown in FIG. 4A. Each S-graph node 5, 6 and 7 corresponds respectively to flip-flops 5, 6 and 7 shown in FIG. 4A.

In block 32, strongly-connected components of the S-graph are determined. A strongly-connected component is a portion of the graph where every node can reach every other node. Referring to FIG. 4B as an example, nodes 6 and 7 can influence each other and are defined to be strongly-connected components. Node 5 is not influenced by node 6 or node 7 and is not considered to be a strongly-connected component.

In block 34, the S-graph of strongly-connected components is transformed into a weighted signed graph (WSG). The WSG is a non-directed graph having edges between nodes. Each edge represents connections between nodes corresponding to a collection of paths between logic gates. Each edge is associated with a value for a weight w and a sign, and the determination of these values will be described in more detail below. In the WSG, edges that are positive are represented by a solid line, edges that are negative are represented by a broken line, edges that are inconsistent and are positive are represented by a solid double line and edges that are inconsistent and negative are represented by a dashed double line.

The WSG includes only nodes of strongly-connected components. Accordingly, the WSG reduces the size of the S-graph while maintaining an optimum feedback vertex set (FVS). The S-graph is transformed into a WSG according to the following conditions:

1) If a node has only edge(s) leaving and no edge(s) entering, the node is removed from the circuit and all incident edge(s) of the node are removed in forming the WSG; and 2) If a node has all edge(s) entering and no edge(s) leaving, the node is removed from the circuit and all incident edge(s) of the node are removed in forming the WSG.

It is noted that edges between a node pair that form a directed cycle in the S-graph would become a pair of undirected edges in the WSG. However, it is observed that an edge pair of art undirected graph is not feasible. Accordingly, the pair of undirected edges are collapsed into a single edge in a conventional WSG. In the present implementation, dummy nodes $D_1$ and $D_2$ are inserted in the WSG between nodes in the S-graph that form a directed pair to provide the WSG with the same cycle of edges between nodes as is represented in the corresponding S-graph.

Signs can be assigned to WSG edges of each node by performing a depth-first search (DFS) on the nodes as a recursive function. Back-edge (u, v) connecting node u to an ancestor v in a depth-first tree is represented in the WSG. Self-loops are also removed from the WSG. Accordingly, every circuit of the S-graph cycle can be identified by the back-edges. A tree-edge is an edge in the depth-first forest. Edge (u, v) is a tree edge if v was first discovered by exploring (u, v). A positive sign is assigned in the WSG to tree-edges and a negative sign is assigned to the back-edge of each component. If a set of cycles share a back-edge, it will be the only back-edge in the edge-set of the cycle set, thereby making every S-graph cycle unbalanced.

Edge weights can be assigned for each edge in the WSG according to a depth-first basis by recursively assigning decreasing weights to the tree-edges and back-edges of each component. A first node in the ordered graph is selected as an initial node having an initial weight K such that $K \geq |E|+1$, wherein E is the number of edges. For example, the initial node can be the node closest to the output of the circuit. From the initial node, weights w are assigned along edges depth-first such that $w_i = K - k$; $k>0$; $i \in |V|$ wherein V is the number of nodes. The edge weights can also be multiplied by a common integer value, for example the integer value 10. Accordingly, every edge of the WSG is weighted in decreasing order along directed cycles.

FIG. 4C illustrates a WSG of the S-graph shown in FIG. 4B. In the WSG nodes that are not strongly connected components are removed from the S-graph. Nodes 6 and 7 which are strongly connected components in the S-graph are used in the WSG. Node 5 which is not a strongly connected component in the S-graph is not used in the WSG. Weights are assigned recursively from node 7 which is closest to the output. Weights are assigned decreasing values from node 7, weight 50, node d weight 40, node 6, weight 30, and node d2, weight 20. The edge from d2 to 7 is a back edge which is given a negative value.

Figure 5:
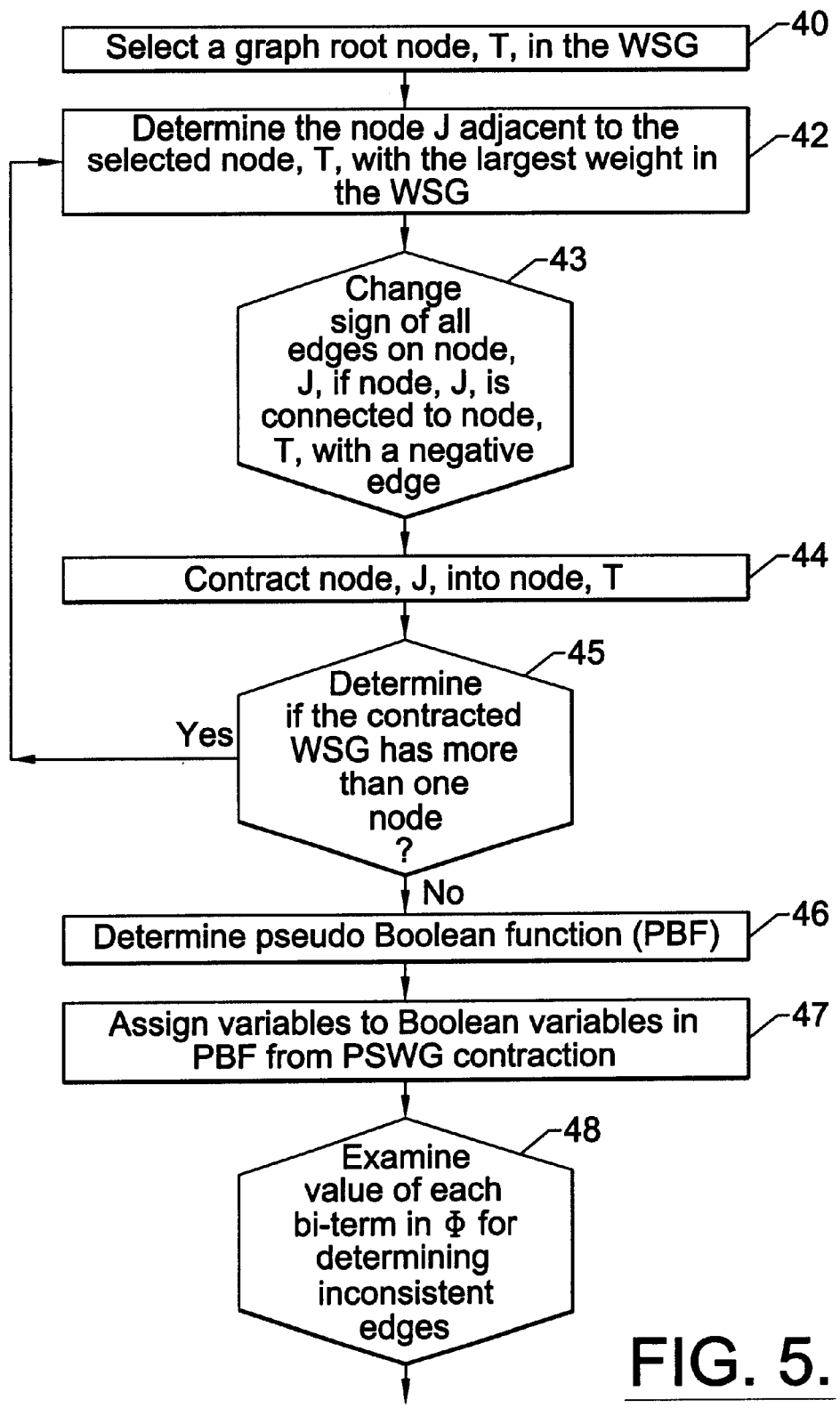
FIG. 5 is a flow diagram of a method for optimally balancing the WSG using the DDT heuristic.

In block 35, a devour, digest and tidy up (DDT) heuristic is used to optimally balance the WSG. It has been found that the solution obtained by the WSG balancing provides a near optimal FVS. FIG. 5 illustrates an implementation of the block optimally balancing the WSG using a DDT heuristic 35. A graph root node, T, of the WSG is selected in block 40. In block 42, a node, J, adjacent to node, T, having the largest edge weight in the WSG is determined. If node, J, is connected to node, T, with a negative edge, the sign of all edges incident on node J are changed, in block 43. In block 44, node, J, is contracted into node, T. Accordingly, the contraction is performed by adding the Boolean variable J to the list of variables in node, T, if node, J, was connected to node, T, by a positive edge in the WSG. The complemented Boolean variable J is added to the list of variables of node, T, if node, J, was connected to node, T, by a negative edge in the WSG. After the variables are added to the list of variables in node, T, node, J, and all edges between node, J, and node, T, are dropped from the WSG. If edges go from both node, T, and node, J, to a common node, the two edges are replaced with a common edge having an edge weight that is a combination of the edge weights from the edge between node, T, to the common node and an edge between node, J, to the common node.

In block 45, a determination is made as to whether the contracted WSG has more than one node. If the contracted WSG has more than one node steps 42, 43, 44 and 45 are repeated. If the contracted WSG has one node, a pseudo-Boolean finction (PBF) is determined, in block 46. A PBF is a Boolean function having real value multipliers for each clause and using arithmetic addition (+) and multiplication (×) operators instead of Boolean AND and OR operations. The PBF can be represented by a set of Boolean variables defined by:

$$L = \{x_1, x_2 x_3 \ldots x_n\}$$

and a set of complimented Boolean variables denoted by:

$$\bar{L} = \{\bar{x}_1, \bar{x}_2 \bar{x}_3 \ldots \bar{x}_n\}$$

A PBF bi-form contains a positive bi-term for every positive edge in the original WSG before contraction and a negative bi-term for every negative edge in the original WSG before contraction. Each bi-term is multiplied by its corresponding edge weight. The sum of the bi-terms provides the PBF bi-form φ. The PBF bi-form φ is a mathematical representation of the original WSG. Thereafter, Boolean variables determined during the WSG contraction are assigned to the PBF bi-form, in block 47 of FIG. 5.

In the WSG with Boolean assignments, a consistent positive edge is determined if both nodes connected by the edge are assigned the same Boolean value. Accordingly, a consistent positive edge has either both nodes assigned Boolean variables of "1" or "0". A consistent negative edge is determined if one node connected by the edge is assigned a Boolean value that is different than the Boolean value assigned to the other node connected by the edge. Accordingly, a consistent negative edge has one node assigned a "0" and the other node assigned a "1" or vice versa.

In block 48, each bi-term in the determined PBF bi-form φ is examined. If the bi-term value is not zero, the corresponding edge in the WSG is inconsistent with the Boolean variable assignment. Referring to FIG. 5, blocks 46, 47 and 48 are considered as the tidy up portion of the DDT heuristic. In block 37 of FIG. 3, flip-flops are selected for partial scan if it is determined from the DDT heuristic that an edge of the flip-flop is inconsistent in the PBF bi-form.

FIG. 4D illustrates a first contraction using the DDT heuristic on the WSG shown in FIG. 4C. In FIG. 4C, node 7 is selected as the graph root node, T, from block 40. Adjacent node d1 is determined as the node adjacent to node 7 having the highest edge weight, a value of 50 in the WSG, from block 42. Node d1 is contracted into node 7. Node 7 is represented by variable $\bar{7}$. Since node d1 was connected to node 7 by a positive edge, the same sign variable which is complemented as variable $\overline{d1}$ is added to node 7.

FIG. 4E illustrates a second contraction using the DDT heuristic on the WSG shown in FIG. 4D. In FIG. 4D, node 6 has the highest edge weight, a value of 40, in the WSG. Node 6 is contracted into node 7. Since node 6 was connected to node 7 by a positive edge, the complement represented as variable $\bar{6}$ for node 6 is added to node 7.

FIG. 4F illustrates a third and final contraction using the DDT heuristic on the WSG shown in FIG. 4E. Node d2 has the highest edge weight, a value of 30, in the WSG. Node d2 is contracted into node 7 and complemented variable $\overline{d2}$ is added to node 7. FIG. 4G illustrates a representation of the original WSG with Boolean assignments determined from the DDT heuristic. The Boolean variables are represented adjacent each node. The set of Boolean values {0000} were determined for respective node set {76d$_1$d$_2$}. Accordingly, the Boolean values are represented as "0" for each node. The PBF bi-form of the original WSG is represented by the following:

$$\phi = 40(x_{d1}\bar{x}_6 + x_6\bar{x}_{d1})$$

$$+30(x_{d2}\bar{x}_6 + x_6\bar{x}_{d2})$$

$$+20(x_{d2}x_7 + \bar{x}_{d2}\bar{x}_7)$$

$$+50(x_{d1}x_7 + \bar{x}_{d1}\bar{x}_7)$$

The overall DDT heuristic complexity is O(V×E). The complexity of building the connected components using a graph depth-first search is Θ(V+E). The complexity of assigning graph weights and signs is two depth-first searches. The complexity of determining the MFVS from the DDT solution is O(V). Hence, the complexity of the approach is determined by the order of DDT, which is O(V×E). Assume that |E|≈15, which is true in most logic circuits. Therefore, the DDT heuristic, when applied to the MFVS problem has complexity O(n), n being the number of graph nodes. In the above-described method, DDT is repeated with every graph node as the root, and we take the solution with the fewest number of inconsistent edges. Accordingly, its complexity becomes O(n$^2$). In comparison, conventional MFVS algorithms have exponential or polynomial complexity.

From the determination of the PBF bi-form or review of FIG. 4F, it is shown that the positive edges from node 7 to node d1, node d1 to node 6 and node 6 to d2 have the same Boolean value of "0" assigned to each node connected to the respective edge and are consistent. The negative edge from node d2 to node 7 also has the same Boolean value of "0" on each node connected to the edge and is inconsistent. Accordingly, the optimal FVS is node 7 and node 7 is selected for partial scan, in block 37. After delay fault testing is performed in block 25 the circuit can be modified to avoid hazards occurring in the circuit during testing.

Figure 6:
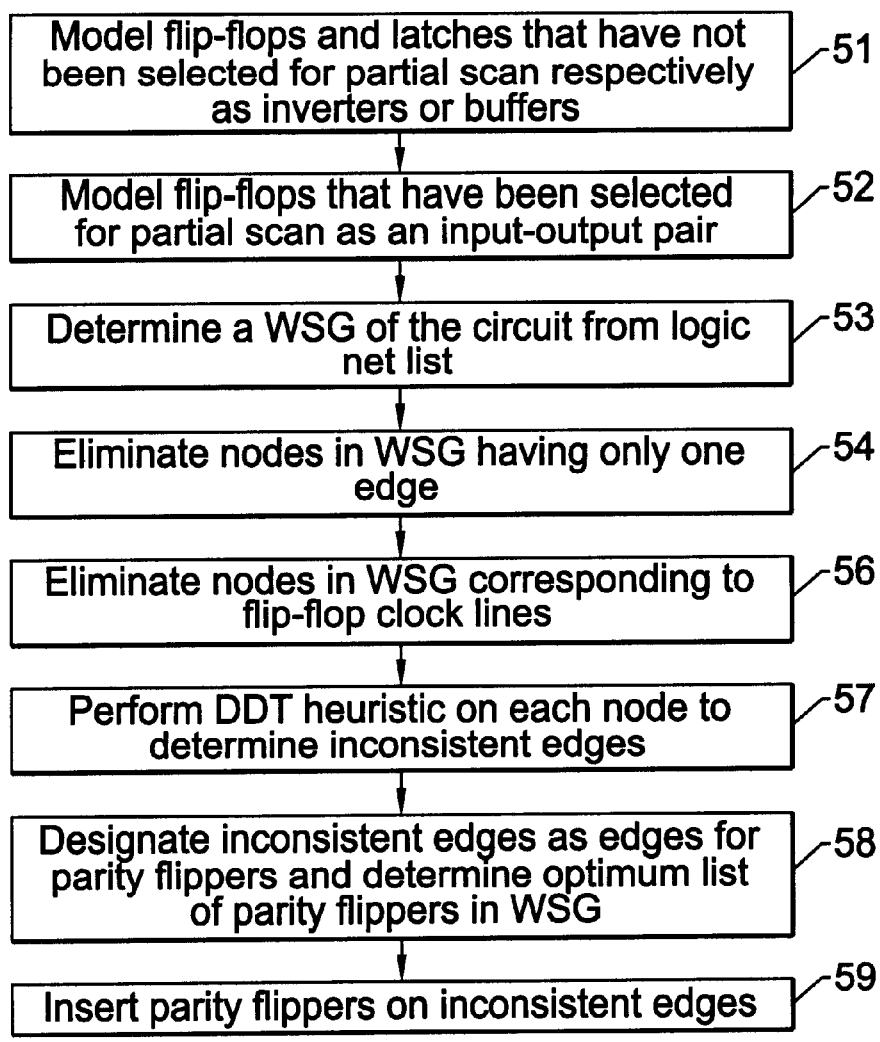
FIG. 6 is a flow diagram of a method of removing hazards in a sequential circuit.

FIG. 6 is a flow diagram of a method of hazard removal in a sequential circuit 50. Flip-flops in reconvergent fanout effectively invert transitions along the path through the flip-flop. Rising or falling transitions at the flip-flop inputs are delayed by one clock cycle before gates on their outputs see the transition. In reconvergent fanout, gates on other path(s) see the transition in the current clock, so it appears inverted at the reconvergence point when signals are changing. It is observed that the Q output, when the input to the flip-flop is changing due to rising or falling transitions, always behaves opposite to the D flip-flop input, late in the clock period.

Figure 7A:
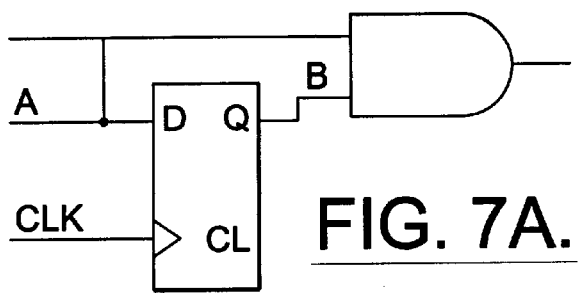
FIG. 7A is a circuit diagram of a reconvergent fanout.
Figure 7B:
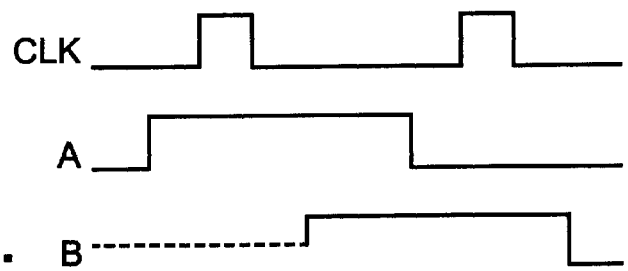
FIG. 7B is a timing diagram of the circuit shown in FIG. 7A.
Figure 7C:
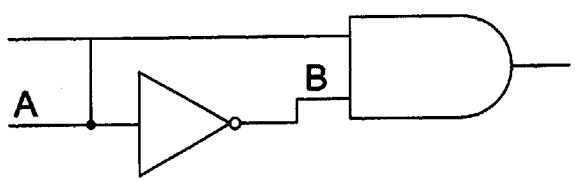
FIG. 7C is a model of the circuit of FIG. 7A as an inverter.

In block 50, flip-flops and latches in the circuit that have not been selected for the addition of partial scan hardware, in block 37, are modeled as buffers or inverters. For example, the flip-flops can be D, JK, SR and T flip-flops. FIGS. 7A–7C illustrate a representation flip-flop asynchronous timing node. FIG. 7A represents an example of a reconvergent fanout and FIG. 7B represents timing of the circuit shown in FIG. 7B. FIG. 7C illustrates modeling the flip-flop as an inverter. In block 52, flip-flops that have been selected for the addition of partial scan hardware, in block 37, are modeled as an input-output pair. A WSG of the circuit is determined in block 53. The WSG is determined by including a node for every logic gate or flip-flop. If a logic gate input is driven by an inverting gate, the edge from the inverting gate to the logic gate is designated a negative sign and all other edges in the WSG are assigned a positive sign.

In block 54, nodes of the WSG having only one edge are eliminated from the WSG. It is observed that nodes with only one edge are not nodes with cycles. In block 56, nodes corresponding to flip-flop clock lines are eliminated from the WSG. Alternatively, nodes corresponding to flip-flop clock lines could be maintained for use in a synchronous circuit testing. Weights are assigned arbitrarily, based on actual circuit delays or based on pre-selected favored paths for receiving minimum hardware during testing.

In block 57, a DDT heuristic is performed for each node in the WSG to determine inconsistent edges. The DDT heuristic can be performed with blocks 40–48 described above. An inconsistent edge is designated as an edge for assignment of a parity flipper, in block 58. The DDT heuristic is performed on the WSG starting with a root node, T. The list of edges for assignment of a parity flipper is saved. The DDT heuristic is performed on the next depth node. After performance of the DDT heuristic, if the DDT heuristic produced fewer parity flips than earlier DDT heuristic determinations, the parity list is replaced with the list from the node, T. Alternatively, if the DDT heuristic produced a greater number of parity flippers to be inserted then subsequent DDT heuristic determinations, the results of the node, T, DDT heuristic determination are discarded. In block 59, parity flippers are inserted on determined inconsistent edges to invert the sign of the edge and balance the WSG.

Figure 8A:
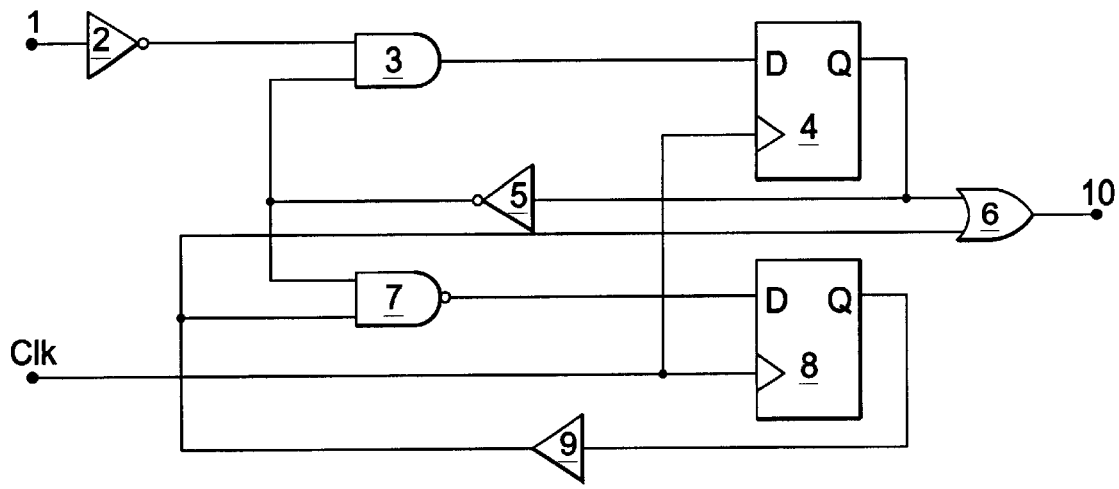
FIG. 8A is a circuit diagram.
Figure 8B:
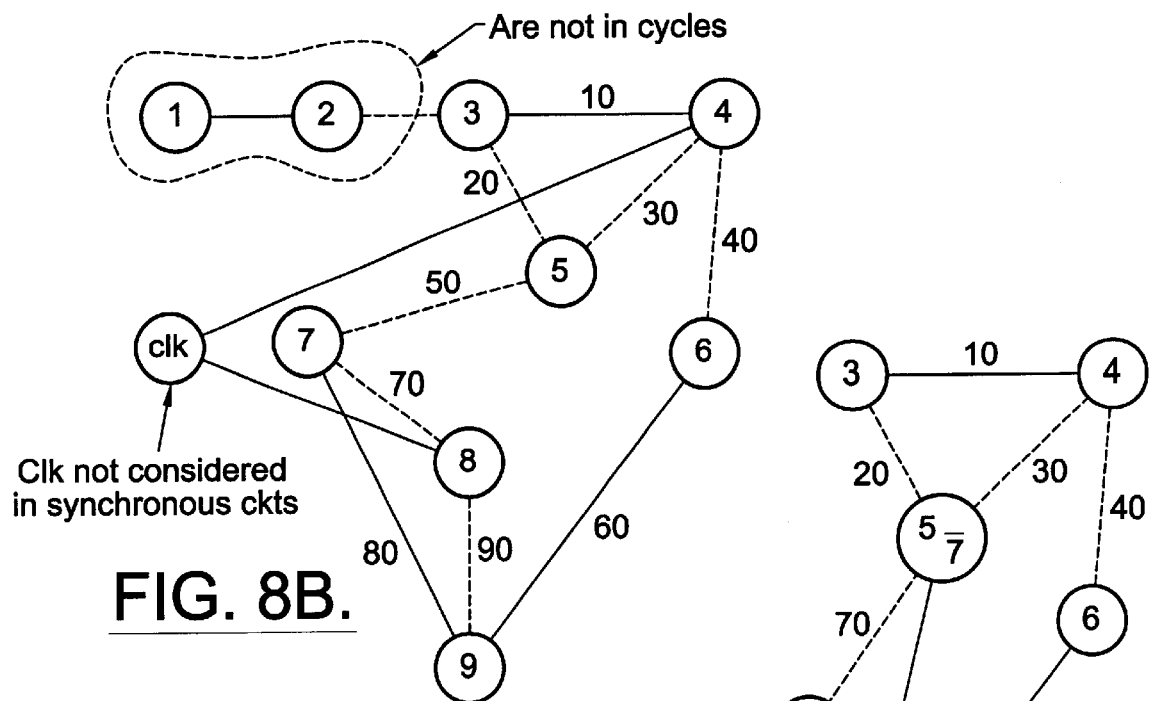
FIG. 8B is a WSG of the circuit shown in FIG. 8A.

An example of hazard removal in a sequential circuit is shown in FIGS. 8A–8J. FIG. 8A is a circuit diagram of an example circuit. FIG. 8B is a WSG of the circuit shown in FIG. 8A. Node 10, clk, node 1 and node 2 are omitted from the WSG since these nodes do not form cycles.

In this example, weights are assigned to the WSG to have higher weights on the path from node 8 through node 9 representing the path being from the flip-flop to the output 10 in the circuit. The edge between node 8 and node 9 is given the highest weight of 90. The paths from node 9 to node 7 and from node 8 to node 7 are provided higher weights for favoring the loop of the flip-flop. Accordingly, the path from node 9 to node 8 and node 8 to node 7 are provided with the next highest weights respectively of 80 and 70. The output through node 9 to node 6 which is applied to output 10 in the circuit is provided with the next highest weight of 60. All other weights are assigned arbitrarily.

Figure 8C:
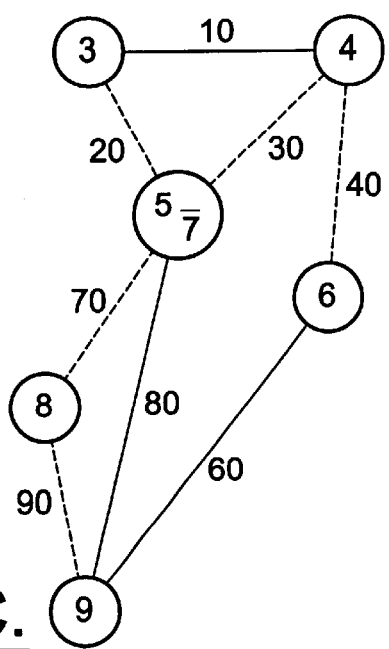
FIG. 8C is a WSG of the circuit after a first contraction using the DDT heuristic.

Node 5 is denoted as the root node, according to block 40 of FIG. 5. The edge adjacent node having the largest weight is determined as the edge between node 5 and node 7, having the weight of 50, according to block 42. As the edge between node 5 and node 7 is negative, the variable assigned to node 7 is assigned a value opposite root 5 and is represented by $\overline{7}$, according to block 43. Node 7 is contracted into node 5, according to block 44. FIG. 8C illustrates the WSG after the above-described first contraction. The contraction absorbs the node connected to the root with the highest edge weight into the root and adjusts the weights of all nodes that are connected to both the root node and the contracted node without eliminating any nodes. The contracted edge weights between the root node 5 are added or subtracted. Accordingly, after node 7 is contracted into node 5, the edge between node 5 and node 7 is removed.

Figure 8D:
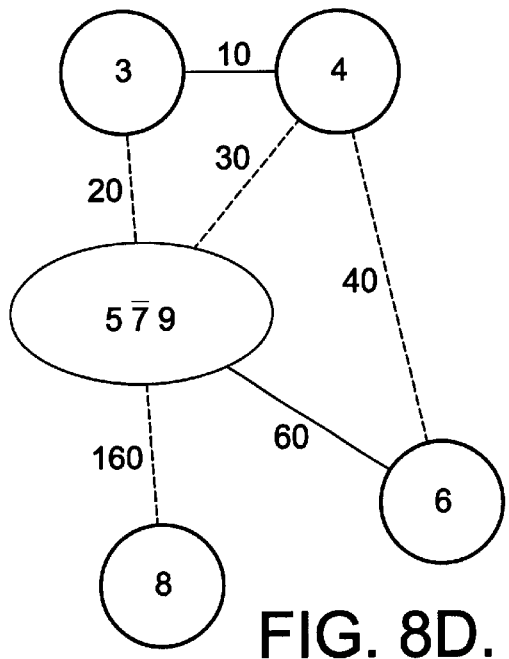
FIG. 8D is a WSG after a second contraction using a DDT heuristic.

Referring to FIG. 8D, a second contraction is performed, with blocks 40 to 45 of FIG. 5, for contracting node 9 into root node 5. Node 9 is the node connected to node 5 having the largest weight after the first contraction. As the edge between node 9 and node 5 is positive, the sign of node 9 is assigned the same value as root node 5 and is represented by 9. Node 9 is contracted into node 5.

Figure 8E:
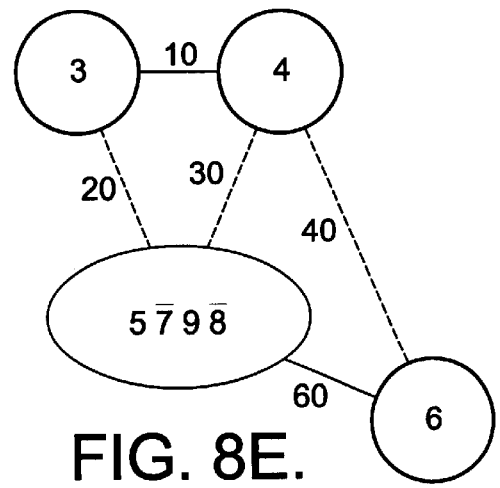
FIG. 8E is a WSG after a third contraction using a DDT heuristic.
Figure 8F:
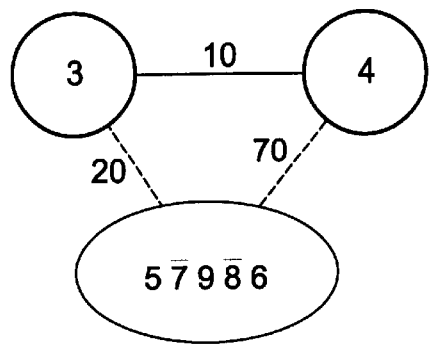
FIG. 8F is a WSG after a fourth contraction using a DDT heuristic.
Figure 8G:
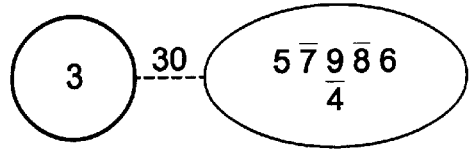
FIG. 8G is a WSG after a fifth contraction using a DDT heuristic.

FIG. 8E illustrates the WSG after a third contraction in which node 8 is contracted into the root node using the above-described procedure for assigning a completed variable $\overline{8}$ to the root node. FIG. 8F illustrates the WSG after a fourth contraction in which node 6 is contracted into the root node. Node 6 is assigned a positive variable of 6. FIG. 8G illustrates the fifth contraction of the WSG in which node 4 is contracted into the root node. The sign of the edge between node 3 and node 4 changes because node 4 is connected by a negative edge to result in a value of 30 on the negative edge between node 3 and the root node. Node 4 is assigned the complimented variable $\overline{4}$ which is added to the root node. FIG. 8H illustrates the sixth and last contraction of the WSG since the WSG does not have more than one node. Node 3 is assigned the complimented variable $\overline{3}$ to add to the root node. FIG. 8I illustrates the original WSG after the assignment of the Boolean values from the last contraction, according to blocks 46 and 47 of FIG. 5. The value of each bi-term can be determined to determine inconsistent edges according to block 48 of FIG. 5. The inconsistent edges are the edge between node 7 and node 8 and the edge between node 8 and node 9. The inconsistent edges are flipped with a parity flipper, according to block 59 of FIG. 6. It is noted that parity flipper hardware is not added on the paths to the output which are edges between node 8 to node 9 and between node 9 and node 6, since these were the most highly weighted edges. The Boolean variables are represented adjacent each node. FIG. 8J illustrates the insertion of parity flippers, represented by dotted lines, in the original logic circuit for elimination of hazards.

Figure 9:
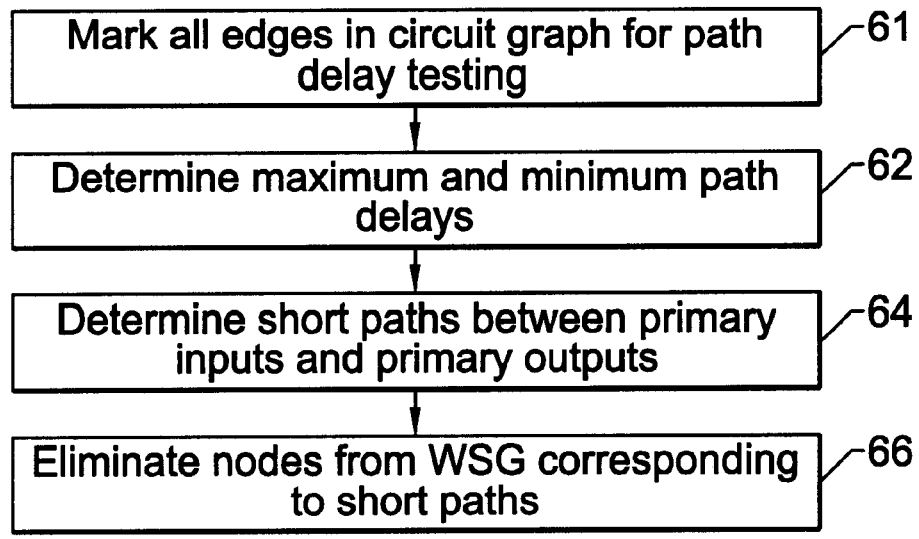
FIG. 9 is a flow diagram of a method for eliminating short paths in the circuit.

FIG. 9 illustrates a flow diagram of a method for eliminating short paths in the circuit under test 60. The method for eliminating short paths in the circuit under test can be performed as a pre-processing step before the circuit is modeled for delay-fault BIST, determined in block 24. It has been found that the destination of every circuit timing path is either a flip-flop or a primary output. During path-delay fault testing, hazards can either be prevented from appearing along the tested path or the hazards can damp out before the destination flip-flop is clocked or the primary output is sampled at the end of the clock period. A short path is a path having a cumulative worst-case rising or falling transition that is short such that, even in the presence of a distributed delay fault along the path any hazards on the path will settle well before the next clock edge appear.

In block 61, every wire according to a logic net list of the circuit sets a delay testing flag for testing path-delay faults. In block 62, the circuit is traversed in breadth-first fashion from primary inputs to primary outputs to determine maximum path delay and minimum path delays of all paths in the circuit. For each logic gate the minimum path delay and maximum path delay are determined by:

(a) max_path_delay=max(logic_gate_input_path_delays)+inertial_gate_delay (b) min_path_delay=min(logic_gate_input_path_delays)+inertial_gate_delay In block 64, the circuit is traversed in breadth-first fashion from primary outputs to primary inputs to determine short paths. For each circuit node an allowed slowest path is determined by the equation $$\text{allowed\_slowest\_path} = \frac{(\text{clock\_period} - \text{longest\_path\_delay\_to\_PO})}{(1 + \text{assumed\_delay\_fault\_fraction})} \quad (a)$$

A comparison is performed between the allowed slowest path and the maximum path delay. If the allowed slowest path is greater than the maximum path delay the node is in short paths and need not be tested for path delay faults. A delay testing is flag set to mark the node not to be tested for path delay faults. Delay testing flags on all node fanout edges and node fan-in edges are cleared. In block 66, nodes are eliminated from the WSG of the circuit if the delay testing flag is set not to be tested for path delay faults. The WSG is determined for nodes having the delay testing flag set for testing path delay faults.

Figure 10:
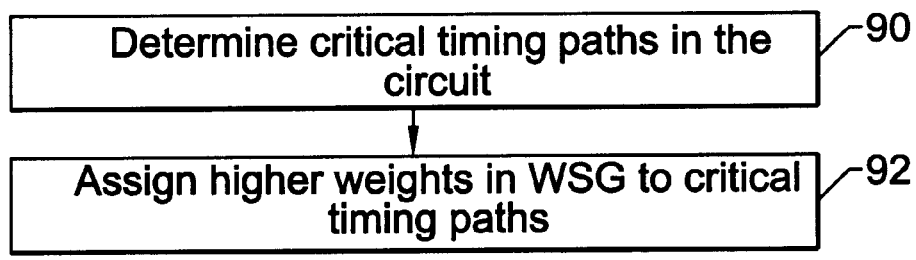
FIG. 10 is a flow diagram of an alternative method for determining weights of edges in the WSG.

An alternative method for determining the weight of the WSG determined in block 53 is shown in FIG. 10. In block 90, a critical timing path is determined for each circuit under test. The critical timing path can be obtained from the delay assignments determined in the method for eliminating short paths in the circuit under test 60. In block 92, higher weights are assigned to edges in the WSG along the critical circuit timing path. It has been found that this method of assigning edge weights results in testability hardware being moved off critical timing paths.

Figure 11A:
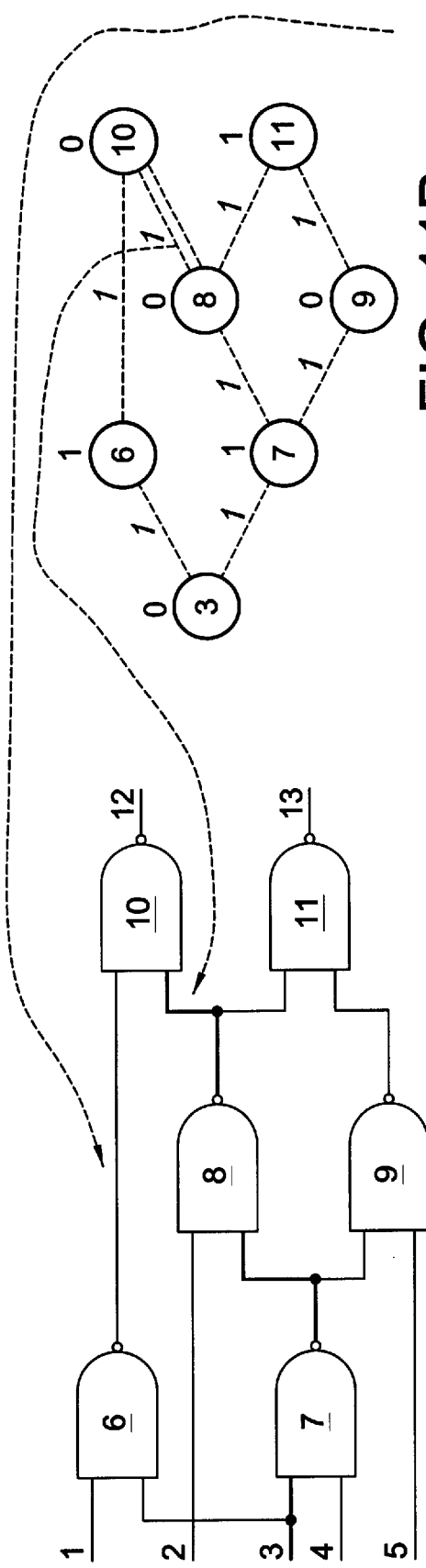
FIG. 11A is a circuit diagram of a $c_{17}$ circuit.
Figure 11B:
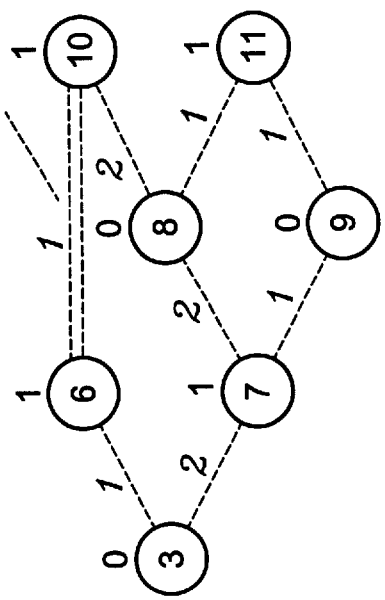
FIG. 11B is a WSG of the circuit shown in FIG. 11A with equality weighting of edges.
Figure 11C:
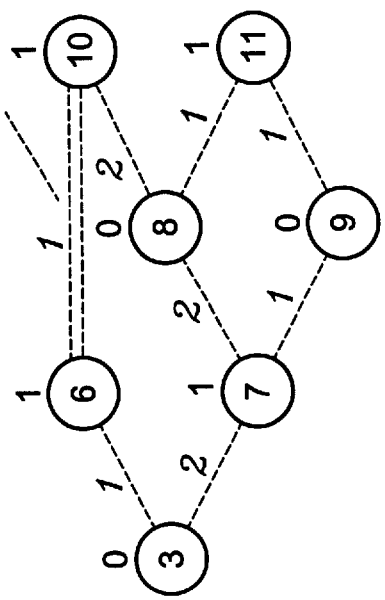
FIG. 11C is a WSG with higher weighting of edges on critical timing paths.

FIGS. 11A–11C illustrate a comparison of an equality weighting scheme of the WSG and the method for determining the weighting of the WSG. FIG. 11A illustrates a circuit to test which is the c17 circuit. The critical timing path is through primary input 3, NAND gate 7, NAND gate 8 and NAND gate 10. FIG. 1B illustrates a WSG of the circuit shown in FIG. 11A. In FIG. 11B, all edges of the WSG are assigned the same value of "1". All edges in the circuit are negative. Upon performing block 57, it is determined that the cycle from primary input 3, NAND gate 7, NAND gate 8, NAND gate 10 and NAND gate 6 and the cycle from primary input 3, NAND gate 7, NAND gate 9, NAND gate 11, NAND gate 8, NAND gate 10 and NAND gate 6 are unbalanced. Following block 59, a parity flipper is inserted in the original circuit along the edge from NAND gate 8 to NAND gate 10. It is observed that the parity flipper is inserted on a critical timing path. Insertion of the testability hardware or a circuit timing path is undesirable because the additional hardware will slow down the critical timing path. FIG. 11C illustrates an implementation of the method for determining weighting of the WSG 90. The edges of the critical timing path are between primary input 3, NAND gate 7, NAND gate 8 and NAND gate 10. The edges of the critical timing path are assigned a higher weight value of 2. All other non-time critical edges are assigned with a lower weight value of 1. After performing block 57, an inconsistent edge is determined to be on the edge from node 6 to node 10. Following block 59, a parity flipper is inserted in the current path in the original circuit from NAND gate 6 to NAND gate 10. It is observed that in this implementation no hardware is added to the critical timing path.

Experiments were performed on ISCAS '89 Benchmark circuits. In the experiments, combinational false timing paths were eliminated from delay-fault BIST testing. It has been found that for combinational circuits, this step removes 34% of the parity flipper hardware. The experiments were performed on a Sparcstation 20 with 32 MBytes of memory. First, the circuit was modeled for delay fault BIST using a DDT heuristic to select flip-flops to scan. Next, block 50 was performed to use a DDT heuristic to select circuit locations for inserting parity flippers to remove hazards. Thereafter, the area overhead (calibrated to the AMD K6™ fabrication line) was computed and the stuck-fault and path-delay fault coverages were computed.

Table 1 illustrates a comparison of the method for combined stuck-fault testing and partial scan delay-fault built in self test (BIST) 20 of the present invention and conventional results for full scan testing. Example A refers to results of Chakradhar, Agrawal described in S. T. Chadkradhar, A. Balakrishnan, and V. D. Agrawal, An Exact Algorithm for Selecting Partial Scan Flip-Flops. J. Electronic Testing: Theory and Applications, 7(1/2):83–94, August/October 1995. Example B refers to results of Lee and Reedy described in D. Lee and S. M. Reddy, On Determining Scan Flip-Flops in Partial-Scan Designs. In Proc. of the Int'l. Conf. on Computer-Aided Design, pages 322–325, November 1990. It is noted that Lee & Reedy did not publish cpu time. Example C refers to results of the method for combined stuck fault testing and partial scan delay fault built in self test 20 in which a depth-first weighting scheme was used to assign edge weight values in the WSG. In the method for combined stuck fault testing and partial scan delay fault built in self test 20, sequential false timing paths were not dropped. The method to eliminate short paths of the circuit under test 60 was performed to eliminate short paths that cannot cause a malfunction even with worst-case delay fault assumptions. Table 1 shows that the average chip area hardware overhead for the 10 largest benchmark circuits using the method of the present invention is −8.126% compared to results for full-scan described by Icheleberger and Williams. The results also show the number of parity flippers inserted by performing the method of hazard removal 50 for deglitching. Accordingly, less hardware is used in the delay-fault BIST than for full-scan. The method for combined stuck fault testing and partial scan delay fault built in self test determined the optimal MFVS for all circuits except seven.

TABLE 1

Table 13: Results for Partial-Scan FVS and Flipper Insertion & Comparisons to Full-Scan

| Ckt. | # Gates + # Flip-Flops | # Flip-Flops | # Flip Flops Scanned | | | CPU Tim (sec.) | | Deglitching of C | | Chip Area Overhead of C |
|---|---|---|---|---|---|---|---|---|---|---|
| | | | A | B | C | A | C | # Parity Flippers | CPU Time (sec.) | |
| s208 | 112 | 8 | 0 | 0 | 0 | 0 | 0.0 | 17 | 1.30 | −4.16 |
| s298 | 169 | 14 | 1 | 1 | 1 | 0.1 | 0.0 | 31 | 4.60 | −1.16 |
| s344 | 168 | 15 | 5 | 5 | 5 | 0.1 | 0.0 | 20 | 2.60 | 1.69 |
| s349 | 169 | 15 | 5 | 5 | 5 | 0.1 | 0.0 | 25 | 0.80 | 3.42 |
| s382 | 207 | 21 | 9 | 9 | 9 | 0 | 0.4 | 4 | 0.10 | −9.44 |
| s386 | 229 | 6 | 0 | 5 | 5 | 0.1 | 0.1 | 1 | 0.00 | 3.12 |
| s400 | 214 | 21 | 9 | 9 | 9 | 0 | 0.4 | 8 | 0.50 | −6.48 |
| s420.1 | 234 | 16 | 0 | 0 | 0 | 0 | 0.0 | 23 | 3.80 | −7.74 |
| s444 | 233 | 21 | 9 | 9 | 9 | 0 | 0.3 | 3 | 0.00 | −9.12 |
| s510 | 245 | 6 | 5 | 5 | 5 | 0.1 | 0.1 | 6 | 0.20 | 4.94 |
| s526 | 214 | 21 | 3 | 3 | 3 | 0 | 0.0 | 44 | 16.10 | −0.75 |
| s526n | 305 | 21 | 3 | 3 | 3 | 0 | 0.0 | 45 | 15.90 | −0.55 |
| s641 | 432 | 19 | 7 | 7 | 7 | 0.1 | 0.0 | 1 | 0.10 | −2.79 |
| s713 | 452 | 19 | 7 | 7 | 7 | 0.1 | 0.0 | 2 | 0.10 | −2.14 |
| s820 | 501 | 5 | 4 | 4 | 4 | 0 | 0.0 | 0 | 0.00 | 2.82 |
| s832 | 507 | 5 | 4 | 4 | 4 | 0 | 0.0 | 0 | 0.00 | 2.69 |
| s838.1 | 478 | 32 | 0 | 0 | 0 | 0 | 0.0 | 19 | 1.60 | −11.63 |
| s953 | 432 | 29 | 5 | 5 | 5 | 0.1 | 0.0 | 0 | 0.00 | −8.31 |
| s1196 | 621 | 18 | 0 | 0 | 0 | 0 | 0.0 | 0 | 0.10 | −5.91 |

TABLE 1-continued

Table 13: Results for Partial-Scan FVS and Flipper Insertion & Comparisons to Full-Scan

| Ckt. | # Gates + # Flip-Flops | # Flip-Flops | # Flip Flops Scanned A | B | C | CPU Tim (sec.) A | C | Deglitching of C # Parity Flip-pers | CPU Time (sec.) | Chip Area Over head of C |
|---|---|---|---|---|---|---|---|---|---|---|
| s1238 | 613 | 18 | 0 | 0 | 0 | 0 | 0.0 | 0 | 0.10 | 4.45 |
| s1423 | 674 | 74 | 21 | 21 | 23 | 0.9 | 477.6 | 14 | 0.20 | −11.92 |
| s1488 | 837 | 6 | 5 | 5 | 5 | 0.1 | 0.1 | 2 | 0.10 | 1.9 |
| s1494 | 835 | 6 | 5 | 5 | 5 | 0.1 | 0.1 | 6 | 0.10 | 2.15 |
| s5378 | 3208 | 179 | 30 | 30 | 31 | 0.1 | 0.1 | 0 | 0.70 | −14.94 |
| s9234 | 5825 | 228 | 53 | 53 | 59 | 0.9 | 6.2 | 18 | 4.30 | −8.46 |
| s13207 | 8620 | 669 | 59 | 59 | 60 | 0.4 | 28.2 | 482 | 19.00 | −12.79 |
| s15850 | 10369 | 597 | 88 | 89 | 158 | 48.0 | 6593.4 | 350 | 17.50 | −8.18 |
| s35932 | 17793 | 1728 | 306 | 306 | 306 | 0.5 | 7.5 | 1326 | 12050.80 | −10.11 |
| s38417 | 23815 | 1636 | 374 | 374 | 449 | 32.8 | 152361.8 | 533 | 109.50 | −11.08 |
| s38584 | 20705 | 1452 | 218 | 218 | 424 | 7.7 | 3499.8 | 691 | 146.60 | −7.83 |
| Avg. on 10 lrgst Ckts. | 9268.1 | 657.5 | 115.9 | 116 | 342.2 | 9.11 | 15478.66 | 342.2 | 1234.88 | −8.126[3] |

Table 2 shows absolute hardware overhead results for the 10 largest ISCAS '89 circuits, which are most representative of industrial circuits. The results show 3.51% of the chip area was used for a partial-scan chain and 3.029% of the area was used for BIST. The partial-scan chain area overhead should not be counted as a BIST overhead, since present-day external testing methods for microprocessors all require either partial-scan or full-scan. The results show an 3.029% area overhead which is superior to existing BIST methods, which require between 10 and 20% area overhead.

The hardware overheads were measured on the AMD fabrication line that produces the K6™ microprocessor. The results are compared to the chip area estimates produces by the Synopsys™ chip area estimator for the 0.35 μm. K6 process. This area was calculated by taking logic gate driver sizes into account, and by using a formula to estimate the chip interconnect area. The following BIST hardware was included in the hardware estimation: parity flippers, all BILBO flip-flop and logic gate hardware, input pattern generator feedback networks, and output pattern generator feedback networks. The hardware for the input MUX, the output MUX, the boundary-scan chain, primary input registers, primary output registers, and the test controller was not included because all of this hardware will be provided anyway by the on-chip Boundary Scan system.

TABLE 2

Absolute Hardware Overheads for ISCAS '89 Circuits

| | | BIST Hardware Area Overhead (%) | | |
|---|---|---|---|---|
| Circuit | Partial Scan Area Overhead (%) | Patt. Gen. & Resp. Comp. | Flippers | Total BIST |
| 1423 | 6.23 | 0.7 | 1.18 | 1.88 |
| 1488 | 1.38 | 2 | 0.16 | 2.16 |
| 1494 | 1.33 | 1.93 | 0.47 | 2.4 |
| 5328 | 3.56 | 1.95 | 0 | 1.95 |
| 9324 | 3.28 | 0.48 | 0.31 | 0.88 |
| 13207 | 1.85 | 1.22 | 4.64 | 5.86 |
| 15850 | 4.35 | 0.82 | 3.01 | 3.83 |
| 35932 | 3.44 | 1.14 | 4.68 | 5.82 |
| 38417 | 5.07 | 0.39 | 1.89 | 2.28 |
| 38584 | 4.16 | 0.96 | 2.36 | 3.32 |
| Ave. | 3.51 | 1.159 | 1.87 | 3.029 |

Table 3 shows a comparison path delay fault coverages for ISCAS '89 circuits of the present invention with example D of Path Delay Fault Automatic Test-Pattern generation described in M. K. Srinivas, M. L. Bushnell, and V. D. Agrawal, Flags and Algebra for Sequential Circuit VNR Path Delay Fault Test Generation, In Proc. of the 10th Int'l. Conf. on VLSI Design pages 88–94, January 1997. The BIST method of the present invention achieved a 28.007% validatable non-robust (VNR) path-delay fault coverage on selected ISCAS '89 Benchmarks. The conventional VNR fault coverage for path-delay faults in ISCAS '89 circuits was 12.11%.

TABLE 3

| | Validatable Non-Robust Path-Delay Fault Cov. (%) | |
|---|---|---|
| Circuit | Delay-Fault BIST | Result from Path-Delay Fault Automatic Test-Pattern Generation |
| s208 | 1.408 | 13.1 |
| s298 | 17.965 | 14.94 |
| s344 | 15.634 | 20.85 |
| s349 | 13.973 | 20 |
| s382 | 33.375 | 5 |
| s386 | 87.198 | 29.47 |
| s400 | 25.724 | |
| s420.1 | 2.004 | |
| s444 | 29.065 | 4.58 |
| s510 | 46.341 | 0 |
| s526 | 15.976 | |

TABLE 3-continued

| | Validatable Non-Robust Path-Delay Fault Cov. (%) | |
|---|---|---|
| Circuit | Delay-Fault BIST | Result from Path-Delay Fault Automatic Test-Pattern Generation |
| s713 | 7.104 | 1.06 |
| s820 | 64.837 | |
| s953 | 65.701 | |
| Comparable Circuit Ave. | 28.007 | 12.11 |
| Ave. on All Circuits | 30.45 | 12.11 |

Table 4 illustrates a table of stuck and transaction delay fault coverages determined from the method for combined stuck-fault testing and partial scan delay-fault built-in self test 20. The results show the method has a 98.2% stuck-fault coverage and an 81.72% transition delay-fault coverage on the ISCAS '85 combinational circuits.

TABLE 4

| | Fault Coverages | |
|---|---|---|
| Circuit | Stuck-Fault Cov. (%) | Robust Transition Delay-Fault Cov. (%) |
| c880 | 100.0 | 91.21 |
| c1355 | 98.9 | 100.0 |
| c1908 | 99.78 | 93.84 |
| c2670 | 95.16 | 56.78 |
| c3540 | 96.66 | 55.66 |
| c5315 | 99.12 | 62.36 |
| c5742 | 100.0 | 91.25 |
| c6288 | 99.06 | 99.95 |
| c7552 | 95.1 | 84.43 |
| Ave. | 98.2 | 81.72 |

Figure 12:
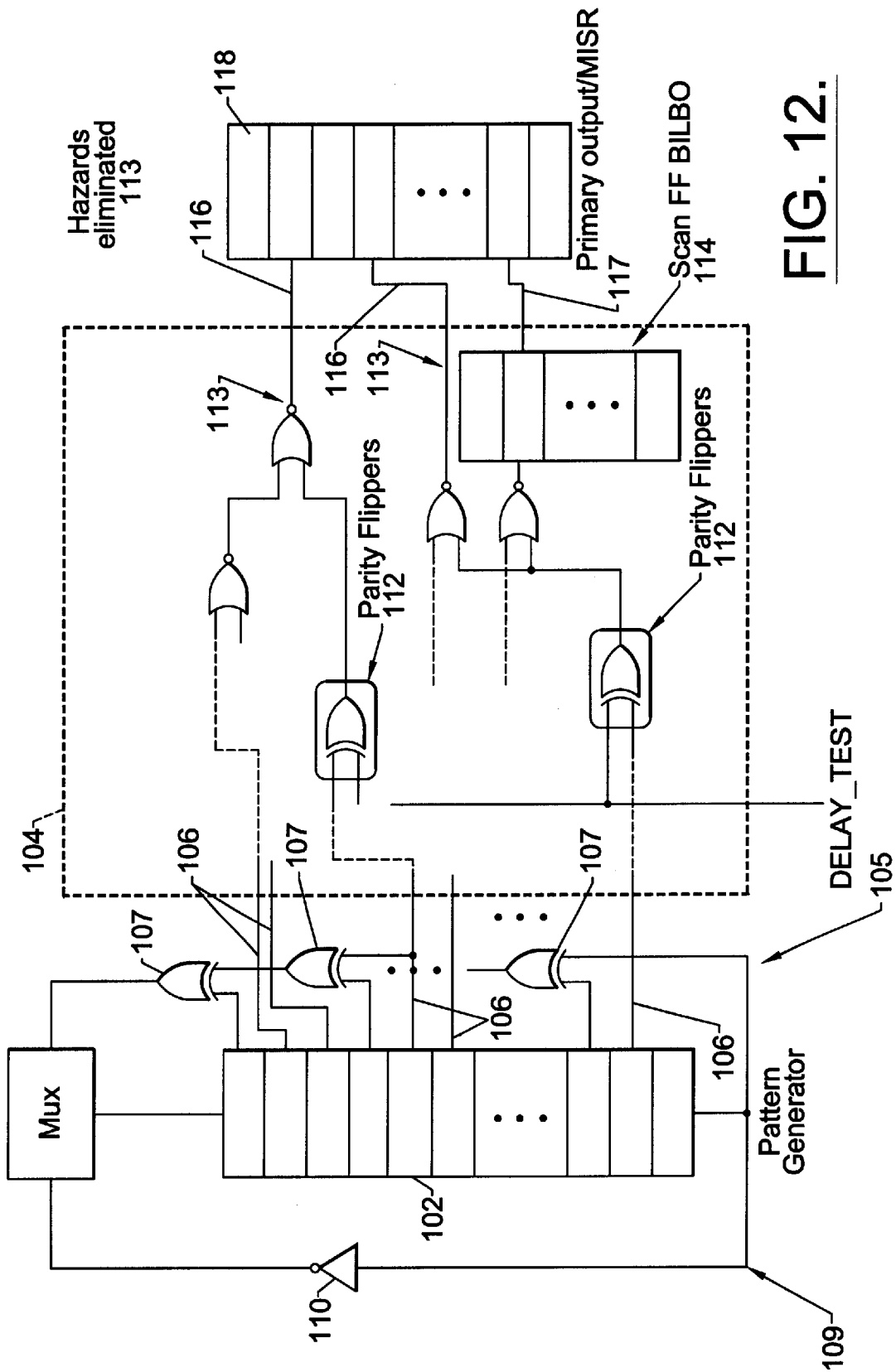
FIG. 12 is a schematic diagram of a combined stuck fault testing and partial scan delay-fault BIST in accordance with the principles of the present invention.

FIG. 12 illustrates an apparatus for sequential circuit delay BIST system 100 in accordance with the principles of the present invention. In BIST system 100, test vector generation and test result verification are accomplished by built-in circuitry. IEEE P1149 JTAG Boundary Scan standard is used with BIST system 100 to provide an input MUX, test controller, flip-flop on every primary input and primary output which components are not shown in FIG. 12. A pattern generator 102 is disposed at the boundary of circuit under test 104 to generate an input pattern for testing the circuit under test 104. During stuck fault testing, performed by blocks 22 and 23 of FIG. 2, pattern generator 102 is configured as a linear feedback shift register (LFSR). Feedback network 105 comprising primary inputs 106 and XOR gates 10, is used to generate random test patterns for stuck-fault testing. During path delay fault testing, performed by blocks 24 and 25 of FIG. 2, pattern generator 102 is configured as a Johnson counter to generate delay-fault test patterns with only a single input change. Feedback network 109 comprising inverter 110 is used in path delay-fault testing.

Circuit under test 104 includes parity flippers 112 of XOR gates which were determined in the method of hazard removal in a sequential circuit 50. Parity flippers 112 eliminate hazards on paths 113. Parity flippers 112 are activated in path-delay fault testing by setting a DELAY_TEST signal to "1". Parity flippers 112 are disabled in stuck-fault testing by setting the DELAY_TEST signal to "0". Partially scanned flip-flops, determined from the block 24 for modeling a circuit for delay-fault BIST, are collected in BILBO 114. Primary outputs 116 of circuit under test 104 are received at output MISR 118. Output 117 from BILBO 114 can pass through additional hardware and is received at output MISR 118. Additional hardware can be present between BILBO 114 and MISR 118 in which case BILBO 114 can be used as a pattern generator for testing the additional hardware. After application of input patterns from pattern generator 102 responses from circuit under test 104 are combined in output MISR 118 and BILBO 114. Output MISR 118 receives a succession of input responses from primary outputs 116 after application of the stuck-fault test pattern and provides a first signature for stuck-fault testing. The BILBO 114, after application of the path delay fault test patterns provides a second signature for path-delay fault testing. The first signature and the second signature can be compared to known pre-computed correct values derived from one-chip comparators that require only 1 logic gate.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. A method for testing a circuit comprising the steps of:
    applying a succession of first input patterns to said circuit for generating stuck-fault output responses to produce a first signature;
    modeling the circuit for delay-fault built-in self test to break flip-flop feedback cycles in said circuit;
    applying a succession of second input patterns to said delay-fault built-in self test for generating delay-fault output responses to produce a second signature; and
    comparing said first and second signatures with a known correct first and second signature for said circuit.

2. The method of claim 1 wherein said first input patterns are generated by a linear feedback shift register.

3. The method of claim 1 wherein said second input patterns are generated by a modified Johnson counter.

4. The method of claim 3 wherein said step of modeling the circuit for delay fault built-in self test comprises the steps of:
    determining a S-graph of said circuit;
    determining strongly connected components of said S-graph;
    determining a weighted signed graph from the S-graph of the determined strongly connected components, said weighted signed graph representing nodes connected by edges, each of said edges being assigned a weight and a sign;
    minimizing said weighted signed graph using a DDT heuristic to balance said weighted signed graph to determine an optimal feedback vertex set; and
    determining insertion of partial scan flip-flops from said optimal feedback vertex set.

5. The method of claim 4 wherein said DDT heuristic is determined by:
    a. selecting a graph root node in said weighted signed graph;
    b. determining an adjacent node to the selected graph root node that has the largest assigned weight in said weighted signed graph;
    c. changing the assigned sign in said weighted signed graph of all edges on said adjacent node if said adjacent node is connected to the selected graph node with a negative edge;

d. contracting said adjacent node into said selected graph root node to provide a contracted weighted signed graph;

e. repeating steps a through d until said contracted weighted signed graph has one node;

f. determining a pseudo Boolean function; and g. assigning a Boolean variable to said pseudo Boolean function from said contracted weighted signed graph for determining said optimal feedback vertex set.

6. The method of claim 5 when said sign of said edges in said WSG is assigned a positive value if said edge is a tree edge and a negative value if said edge is a back-edge.

7. The method of claim 6 wherein said weight of said edges are assigned on a depth first basis by recursively assigning decreasing weights to tree edge and back edges of each node in said weighted signed graph.

8. The method of claim 4 further comprising the step of:

eliminating hazards in said circuit after said step of determining insertion of partial scan flip-flops from said optimal feedback vertex set.

9. The method of claim 8 wherein said step of eliminating hazards comprises the steps of:

modeling flip-flops and latches in said circuit that have not been determined for insertion of said partial scan flip-flops as an inverter or a latch;

modeling flip-flops and latches in said circuit that have been determined for insertion of said partial scan flip-flop as an input-output pair;

determining a second weighted signed graph of said circuit, said second weighted signed graph representing nodes connected by edges, each of said edges, being assigned a weight and a sign;

eliminating nodes in said second weighted signed graph having only one edge;

eliminating nodes in said second weighted signed graph corresponding to flip-flop clock lines;

performing a second DDT heuristic on said second weighted signed graph to determine; inconsistent edges;

determining an optimum list of inconsistent edges for assigning parity flippers to said inconsistent edges; and adding a parity flipper to paths of said circuit corresponding to said optimum list of inconsistent edges.

10. The method of claim 9 wherein said weight of said edges is assigned by determining critical timing paths in the circuit and assigning higher weights in said second weighted signed graph to edges corresponding to said critical timing paths.

11. The method of claim 10 wherein said sign of said edges is assigned a negative value if said edge is driven by an inverting gate and a positive value if said edge is not driven by an inverting gate.

12. The method of claim 4 further comprising the step of:

eliminating a node from said weighted signed graph corresponding to a short path in said circuit before said step of modeling the circuit for delay-fault built in self test.

13. The method of claim 12 wherein said step of eliminating a node from said weighted signed graph corresponding to said short path is performed by the steps of:

determining a logic net list of nodes and wires connecting said nodes;

marking said wires in said logic net list for delay-fault testing;

determining maximum and minimum path delays for each said wire by traversing said circuit from primary outputs to primary inputs;

determining allowed slowest path of each circuit node by traversing said circuit from primary inputs to primary outputs; and determining said short path if said allowed slowest path of each circuit node is greater than said maximum path delay.

14. A system for testing a circuit comprising:

inputs and outputs coupled to said circuit;

a pattern generator coupled to said inputs, for generating a succession of first input patterns for testing stuck faults and a succession of second input patterns for testing delay faults;

means for modeling the circuit for delay-fault built-in self testing;

means for applying said succession of first input patterns to said inputs to generate stuck fault output responses on said outputs;

an output multiple input system register coupled to said outputs receiving said stuck fault output responses and combining said stuck fault output responses in a first signature;

means for applying a said succession of second input patterns to said on inputs of said modeled circuit for delay fault test to generate delay-fault output responses in outputs of said modeled circuit;

a built-in logic block observer receiving said delay fault output responses for processing said output responses into a second signature; and means for comparing said first and second signature with a known first and second signature for said circuit.

15. The system of claim 14 wherein said first input patterns are generated by a linear feedback shift register.

16. The system of claim 14 wherein said second input patterns are generated by a modified Johnson counter.

17. The system of claim 14 wherein said circuit is a sequential circuit.

18. The system of claim 14 wherein said means for modeling the circuit for delay fault built-in self test comprises:

means for determining a S-graph of said circuit;

means for determining strongly connected components of said S-graph;

means for determining a weighted signed graph from the S-graph of the determined strongly connected components, said weighted signed graph representing nodes connected by edges, each of said edges being assigned a weight and a sign;

means for minimizing said weighted signed graph using a DDT heuristic to balance said weighted signed graph to determine an optimal feedback vertex set; and means for determining insertion of partial scan flip-flops from said optimal feedback vertex set.

19. The system of claim 18 wherein said DDT heuristic is determined by:

means for selecting a graph root node in said weighted signed graph;

means for determining an adjacent node to the selected graph root node that has the largest assigned weight in said weighted signed graph;

means for changing the assigned sign in said weighted signed graph of all edges on said adjacent node if said adjacent node is connected to the selected graph node with a negative edge;

means for contracting said adjacent node into said selected graph root node to provide a contracted weighted signed graph;

means for repeating selecting a graph node, determining an adjacent node, changing the assigned sign in a weighted sign graph and contracting said adjacent node into said selected graph root node until said contracted weighted signed graph has one node;

means for determining a pseudo Boolean function; and means for assigning a Boolean variable to said pseudo Boolean function from said contracted weighted signed graph for determining said optimal feedback vertex set.

20. The system of claim 19 wherein said weight of said edges are assigned on a depth first basis by recursively assigning decreasing weights to tree edge and back edges of each node in said weighted signed graph.

21. The system of claim 19 wherein said weight of said edges is assigned by determining critical paths in the circuit and assigning higher weights in said weighted signed graph to critical timing paths.

22. The system of claim 21 wherein said sign of said edges is assigned a negative value if said edge is driven by an inverting gate and a positive value if said edge is not driven by an inverting gate.

23. The system of claim 18 further comprising:

means for eliminating a node from said weighted signed graph corresponding to a short path in said circuit before modeling said circuit for delay-fault built-in testing.

24. The system of claim 14 further comprising:

means for eliminating hazards in said circuit resulting from said molded circuit for delay-fault built-in self testing.

25. The system of claim 24 wherein said means for eliminating hazards comprises:

means for modeling flip-flops and latches in said circuit that have not been determined for insertion of said partial scan flip-flops as an inverter or a latch;

means for modeling flip-flops and latches in said circuit that have been determined for insertion of said partial scan flip-flop as an input-output pair;

means for determining a second weighted signed graph of said circuit, said second weighted signed graph representing nodes connected by edges, each of said edges being assigned a weight and a sign;

means for eliminating nodes in said second weighted signed graph having only one edge;

means for eliminating nodes in said second weighted signed graph corresponding to flip-flop clock lines;

means for performing a second DDT heuristic on said second weighted signed graph to determine inconsistent edges determining an optimum list of edges for parity flippers; and means for adding a parity flipper to each edge in said circuit on paths of said circuit corresponding to each edge of said list of edges for parity flippers.

* * * * *